US011815817B2

United States Patent
Rudolph et al.

(10) Patent No.: US 11,815,817 B2
(45) Date of Patent: Nov. 14, 2023

(54) FIELD FACET SYSTEM, OPTICAL ARRANGEMENT AND LITHOGRAPHY APPARATUS

(71) Applicant: Carl Zeiss SMT GmbH, Oberkochen (DE)

(72) Inventors: Guenter Rudolph, Jena (DE); Joram Rosseels, Putte (BE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/553,040

(22) Filed: Dec. 16, 2021

(65) Prior Publication Data

US 2022/0113633 A1     Apr. 14, 2022

Related U.S. Application Data

(63) Continuation of application No. PCT/EP2020/067049, filed on Jun. 18, 2020.

(30) Foreign Application Priority Data

Jun. 19, 2019 (DE) .......................... 102019208980.1

(51) Int. Cl.
*G03F 7/20* (2006.01)
*G03F 7/00* (2006.01)
(Continued)

(52) U.S. Cl.
CPC ........... *G03F 7/70075* (2013.01); *G02B 5/09* (2013.01); *G02B 26/0825* (2013.01);
(Continued)

(58) Field of Classification Search
CPC ............ G03F 7/70075; G03F 7/70033; G03F 7/70141; G03F 7/7015; G03F 7/70116;
(Continued)

(56) References Cited

U.S. PATENT DOCUMENTS

2004/0257683 A1   12/2004 Petasch et al.
2005/0063076 A1*  3/2005 Shimazu .......... H04B 10/25133
                                                      359/846
(Continued)

FOREIGN PATENT DOCUMENTS

DE         101 51 919 B4     5/2003
DE    10 2013 206 981 A1    12/2013
(Continued)

OTHER PUBLICATIONS

International Search Report and Written Opinion for corresponding PCT Appl No. PCT/EP2020/067049, dated Oct. 21, 2020.

*Primary Examiner* — Mesfin T Asfaw
(74) *Attorney, Agent, or Firm* — Fish & Richardson P.C.

(57) ABSTRACT

A field facet system for a lithography apparatus includes an optical element. The optical element includes a base section having an optically effective surface. The optical element also includes a plurality of lever sections provided at a rear side of the base section facing away from the optically effective surface. In addition, the field facet system includes two or more actuating elements configured, with the aid of the lever sections acting as levers, to apply in each case a bending moment to the base section to elastically deform the base section and thus to alter a radius of curvature of the optically effective surface. The actuating elements are arranged in series as viewed along a length direction of the optical element.

25 Claims, 29 Drawing Sheets

(51) Int. Cl.
  *G02B 5/09* (2006.01)
  *G02B 26/08* (2006.01)
(52) U.S. Cl.
  CPC ........ *G03F 7/7015* (2013.01); *G03F 7/70033* (2013.01); *G03F 7/70141* (2013.01)
(58) Field of Classification Search
  CPC .... G02B 5/09; G02B 26/0825; G02B 5/0891; G02B 5/10
  See application file for complete search history.

(56) References Cited

U.S. PATENT DOCUMENTS

| | | |
|---|---|---|
| 2013/0100429 A1 | 4/2013 | Fiolka et al. |
| 2015/0277233 A1* | 10/2015 | Van Schoot .......... H01F 7/0231 356/152.3 |
| 2019/0041632 A1 | 2/2019 | Erbe |

FOREIGN PATENT DOCUMENTS

| | | |
|---|---|---|
| DE | 10 2015 223 518 A1 | 5/2017 |
| DE | 10 2017 117 468 B3 | 9/2018 |
| DE | 10 2017 221 420 A1 | 11/2018 |

\* cited by examiner

FIELD FACET SYSTEM, OPTICAL ARRANGEMENT AND LITHOGRAPHY APPARATUS

CROSS-REFERENCE TO RELATED APPLICATIONS

The present application is a continuation of, and claims benefit under 35 USC 120 to, international application PCT/EP2020/067049, filed Jun. 18, 2020, which claims benefit under 35 USC 119 of German Application No. 10 2019 208 980.1, filed Jun. 19, 2019. The entire disclosure of these applications are incorporated by reference herein.

FIELD

The present disclosure relates to a field facet system, an optical arrangement including such a field facet system, and a lithography apparatus including such a field facet system and/or such an optical arrangement.

BACKGROUND

Microlithography is used for producing microstructured components, for example integrated circuits. The microlithography process is performed using a lithography apparatus, which has an illumination system and a projection system. The image of a mask (reticle) illuminated by means of the illumination system is in this case projected by means of the projection system onto a substrate (for example a silicon wafer) which is coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses (extreme ultraviolet, EUV) that use light with a wavelength in the range of 0.1 nm to 30 nm, in particular 13.5 nm. In the case of such EUV lithography apparatuses, because of the high absorption of light of this wavelength by most materials, reflective optical units, that is to say mirrors, are typically used instead of—as previously—refractive optical units, that is to say lens elements. The mirrors usually operate either with almost normal incidence or with grazing incidence.

The illumination system generally includes a field facet mirror and a pupil facet mirror. The field facet mirror and the pupil facet mirror can be embodied as so-called facet mirrors, wherein such facet mirrors often have hundreds of facets in each case. The facets of the field facet mirror are also referred to as "field facets" and the facets of the pupil facet mirror as "pupil facets". A plurality of pupil facets can be assigned to one field facet. In order to obtain a good illumination in conjunction with a high numerical aperture, it is often desirable for the one field facet to be switchable between the pupil facets assigned to it.

By virtue of the fact that the one field facet is switchable, the distance between the one field facet and the pupil facet assigned thereto is different for each switching position. Given a fixed refractive power of the one field facet, the image on the corresponding pupil facet can be defocused depending on the switching position. This defocusing can result in a limitation in the reduction of the degree of pupil filling. In the present case here the "degree of pupil filling" should be understood to mean the ratio of an irradiated surface area relative to a total optically effective surface area of the respective pupil facet. Obtaining higher resolutions of the projection system can involve further reducing the degree of pupil filling. It can therefore be desirable for the field facets to be deformable depending on their switching position in order at least to reduce or entirely eliminate the defocusing.

DE 10 2017 221 420 A1 describes various embodiments of deformable field facets. The document proposes for example an actuating element provided on the rear side at a field facet, the actuating element applying a transverse force to the field facet in order to deform the latter and thus to alter a curvature of a mirror surface of the field facet.

DE 10 2013 206 981 A1 discloses various embodiments of deformable field facets. The document proposes for example a field facet with two spaced apart actuating elements being provided at the rear side of the field facet, the actuating elements being suitable for applying a transverse force to the field facet in order to deform the latter and thus to alter a curvature of a mirror surface of the field facet.

DE 101 51 919 A describes an optical element having an optical axis, in particular for an exposure lens in semiconductor lithography, wherein the optical element has at least one extension in the direction of the optical axis.

SUMMARY

The present disclosure proposes an improved field facet system.

In an aspect, a field facet system for a lithography apparatus is provided. The field facet system includes an optical element, wherein the optical element includes a base section having an optically effective surface and a plurality of lever sections provided at a rear side of the base section facing away from the optically effective surface. The optical system furthermore includes two or more actuating elements configured, with the aid of the lever sections acting as levers, to apply in each case a bending moment to the base section in order to elastically deform the base section and thus to alter a radius of curvature of the optically effective surface, wherein the actuating elements are arranged in series as viewed along a length direction of the optical element.

By virtue of the fact that the radius of curvature is not altered by a transverse force acting on the base section, but rather by the bending moment introduced into the base section, a more compact design, a significantly smaller stroke of the actuating elements and also a smaller deviation of the bending line from the circular shape can be achieved in comparison with certain systems in which a transverse force is applied perpendicularly to the optical element in order to deform the optical element. Furthermore, for the case where more than two actuating elements are provided, it is possible for the optically effective surface to be deformed not just as a whole, but only in small regions in a targeted manner.

The field facet system is an optical system or a field facet device or can be designated as such. The field facet system is in particular part of a beam shaping and illumination system of the lithography apparatus. In particular, the field facet system is part of a facet mirror, in particular of a field facet mirror. Such a facet mirror optionally includes a multiplicity of such field facet systems arranged linearly or in the shape of a pattern. In this case, each field facet system can be tilted by itself into a plurality of different tilt positions. For this purpose, the field facet system can include a further actuating element suitable for tilting the entire field facet system as one unit. The actuating element can be a so-called Lorentz actuator.

The optical element is optionally a facet, mirror facet or field facet or can be designated as such. The base section can be rod-shaped, in particular, and optionally has a rectangular geometry in cross section. The base section has a width, a length and a thickness. The ratio of the length to the width is optionally approximately 10:1. The thickness is optionally smaller than the width. A coordinate system having a first spatial direction or x-direction, a second spatial direction or y-direction and a third spatial direction or z-direction can be assigned to the optical element. The spatial directions are positioned perpendicularly to one another.

The width is oriented along the x-direction. Therefore, the x-direction can also be designated as the width direction. The thickness is oriented along the y-direction. Therefore, the y-direction can also be designated as the thickness direction. The length is oriented along the z-direction. Therefore, the z-direction can also be referred to as the longitudinal direction or length direction. The "length direction" should be understood to mean, in particular, that spatial direction in which the optical element has its largest geometry extent. The bending moment is optionally introduced into the base section at an outermost edge or end section as viewed in the length direction. In particular, a bending moment can be introduced into the base section at each lever section. The bending moment acts around the width direction. Accordingly, the deformation of the base section also takes place around the width direction. The deformation of the base section with the aid of the bending moment can bring about a reversible, that is to say non-permanent, reduction of an absolute value of the radius of curvature.

The optical element can be produced from a mirror substrate or substrate. The substrate can include in particular copper, in particular a copper alloy, an iron-nickel alloy, such as Invar, for example, or some other suitable material. The optically effective surface can be provided on the front side at the optical element or at the base section. The rear side can accordingly be provided on the rear side at the base section. The lever sections are optionally embodied integrally, in particular materially in one piece, with the base section. In the present case, "in one piece" or "integrally" means that the base section and the lever sections together form a common component, namely the optical element. In this case, "materially in one piece" means that the optical element—with the exception of the coating used for producing the optically effective surface—is produced from the same material throughout, namely from the substrate. The optical element is thus optionally a monolithic component. However, the optical element can also be constructed from a plurality of combined individual components.

The optically effective surface can be a mirror surface, in particular. The optically effective surface can be produced with the aid of a coating. The optically effective surface can be curved. The shape of the optically effective surface can be a torus or an ellipsoid. For the case where a toroidal geometry is provided, the latter has a vertex. The bending moment can be introduced into the base section at an edge or end section of the base section that is furthest away from the vertex as viewed in the length direction. Furthermore, a bending moment can be introduced into the base section at each lever section as well. The optically effective surface can have a first radius of curvature oriented along the length direction, and a second radius of curvature oriented along the width direction. The radii of curvature are thus optionally positioned perpendicularly to one another. The radii of curvature can intersect at the vertex, in particular. The first radius of curvature is optionally greater than the second radius of curvature. In particular, the first radius of curvature can be altered with the aid of the deformation of the base section. Depending on the arrangement of the actuating elements, however, the second radius of curvature can also be influenced. Hereinafter the first radius of curvature is referred to just as radius of curvature.

For the case where a toroidal geometry is provided, two axes or radii of curvature intersecting at the vertex are provided. Mutually intersecting axes, namely the x-direction and the y-direction, can also be assigned to the optical element itself. The axes can be axes of symmetry or be designated as axes of symmetry. The axes of the toroidal geometry need not correspond to the axes of the optionally rectangular geometry of the optical element. Rather, the axes of the toroidal geometry and the axes of the optical element can be rotated with respect to one another. Typically, the axes can be rotated by 10 to 20° with respect to one another.

The actuating elements can be designated as actuators. Optionally, at least two actuating elements are provided. It is also possible for three, four, five, six, seven, eight, nine, ten or eleven actuating elements to be provided. More than eleven actuating elements are possible as well. The actuating elements are optionally so-called displacement actuators. A "displacement actuator" should be understood to mean an actuating element which, in contrast to the force actuator, does not predefine a fixed force, but rather a displacement. A "force actuator", by contrast, should be understood to mean an actuating element which, in contrast to a displacement actuator, does not predefine a fixed displacement, but rather a force. One example of a displacement actuator is a piezoelement. One example of a force actuator is a Lorenz actuator as already mentioned above. That is to say that the actuating element can be or include a piezoelement or a piezostack.

The fact that the lever sections act in each case as a "lever" or as a "lever arm" should be understood to mean, in particular, that the lever sections are ideally rigid bodies which in each case an actuating force exerted on the respective lever section by the respective actuating element with a lever or lever arm which is transmitted from a distance measured in the thickness direction between the optically effective surface and a coupling point, with the aid of which the respective actuating element is coupled to a corresponding lever section, to the base section. This distance, that is to say the length of the lever or lever arm or of the lever section multiplied by the actuating force results in the bending moment. The distance can therefore also be designated as the length of the lever or lever arm, or of the lever section. In the present case, an "elastic deformation" should be understood to mean the property of the base section of altering its shape under the action of the bending moment and of reverting to its original shape when the bending moment ceases. In particular, the base section can exhibit a linearly elastic behaviour.

The actuating elements are optionally assigned a control unit that makes it possible to drive, in particular energize, the respective actuating element, such that the latter applies the actuating force to the respective lever section. The actuating elements can be brought from an undeflected state to a deflected state with the aid of the energization. An arbitrary number of intermediate states can be provided between the undeflected state and the deflected state. As soon as the actuating elements are no longer energized, they can bring themselves automatically from the deflected state back to the undeflected state. In particular, the radius of curvature can be altered in a continuously variable manner with the aid of the actuating elements.

Optionally, as mentioned above, at least two actuating elements are provided. Accordingly, at least two lever sections are provided, between which the two actuating elements are arranged. For the case where more than two actuating elements are provided, the actuating elements and the lever arms are optionally arranged alternately, such that there is always one lever section arranged between two actuating elements. An outermost or end-side lever section can be provided on the outer side at a respective last actuating element. In the present case, the fact that the actuating elements are arranged "in series" along the length direction means that the actuating elements are positioned one behind another as viewed along the length direction. In this case—as mentioned above—the length direction is defined as the spatial direction along which the optical element has its largest extent.

In accordance with one embodiment, the actuating elements are configured to bring the base section from an undeformed state to a deformed state, and wherein the radius of curvature decreases upon the base section being brought from the undeformed state to the deformed state.

In the undeformed state, the base section is optionally stress-free or at least approximately stress-free. The undeformed state can therefore be designated as the stress-free state. Particularly optionally, however, the base section is not completely stress-free in the undeformed state. That is to say that the respective actuating element is optionally mounted under a prestress. The deformed state can also be designated as a tensioned state. The radius of curvature increases again upon the base section being brought from the deformed state to the undeformed state. An arbitrary number of intermediate states are provided between the undeformed state and the deformed state.

In accordance with an embodiment, the base section is spring-pretensioned in the direction of the undeformed state, such that the base section is configured to bring itself automatically from the deformed state to the undeformed state.

That is to say, in particular, that the base section deforms from the deformed state to the undeformed state as soon as the bending moment no longer acts on the lever section. In particular, the base section also deforms from the deformed state in the direction of the undeformed state as soon as the bending moment is reduced.

In accordance with an embodiment, the actuating elements are configured to apply an actuating force to the lever sections in order to generate the bending moment.

As already explained above, the bending moment results from the multiplication of the actuating force by the length of the respective lever section.

In accordance with an embodiment, a direction of effect of the actuating force is oriented parallel or obliquely with respect to the rear side.

In particular, the direction of effect is not oriented perpendicularly to the rear side. The orientation of the direction of effect can vary with increasing deformation of the base section. "Obliquely" should be understood to mean, in particular, a deviation from a parallel arrangement of not more than 20°±5°, optionally of not more than 15°±5°, more optionally of not more than 10°±5°, more optionally of not more than 5°, more optionally of not more than 3°, more optionally of not more than 1°.

In accordance with an embodiment, the lever sections are oriented perpendicularly to the rear side.

In the present case, "perpendicularly" should be understood to mean an angle of 90°±20°, optionally of 90°±10°, more optionally of 90°±5°, more optionally of 90°±3°, more optionally of 90°±1°, more optionally of exactly 90°. However, the lever sections can also be oriented obliquely with respect to the rear side. However, the length of the lever sections, or of the lever or lever arm, is oriented in particular at exactly 90° with respect to the rear side and in particular with respect to the optically effective surface.

In accordance with an embodiment, the field facet system furthermore includes a centrally arranged actuating element arranged between a first group of actuating elements and a second group of actuating elements.

The centrally arranged actuating element is positioned centrally at the optical element in particular as viewed along the length direction, wherein the two groups of actuating elements are arranged mirror-symmetrically on both sides of the centrally arranged actuating element.

In accordance with an embodiment, a width of the centrally arranged actuating element is both greater than a width of the individual actuating elements of the first group and greater than a width of the individual actuating elements of the second group.

That is to say that the centrally arranged actuating element optionally has the largest width of all the actuating elements.

In accordance with an embodiment, the width of the actuating elements proceeding from the centrally arranged actuating element towards a respective outermost actuating element decreases continuously as viewed along the length direction.

In the present case, "continuously" should be understood to mean that the width of the actuating elements becomes smaller and smaller proceeding from the centrally arranged actuating element towards the two outermost actuating elements. Provision is thus made of a width gradient proceeding from the central actuating element both along the length direction and counter to the length direction. In the present case, a "width gradient" should be understood to mean that the width varies, in particular decreases, proceeding from the central actuating element towards the outermost actuating elements. On account of this width gradient, it is possible to deform the optically effective surface in ever smaller increments proceeding from the centrally arrange actuating element outwards as viewed along the length direction. This has the technical effect that the optically effective surface can be deformed with greater accuracy at its outermost edge regions as viewed along the length direction. This improves the optical performance.

In accordance with an embodiment, the optical element has a coupling section provided at the rear side, and wherein an actuating element is in each case arranged between the lever section and the coupling section.

In particular, the actuating element provided for tilting the field facet system acts on the coupling section. Optionally, a bearing element received at least partly in the coupling section is provided, wherein a respective actuating element is supported on one of the lever sections and on the bearing element. That is to say that the actuating element is supported on the coupling section with the aid of the bearing element. The bearing element is fixedly connected to the coupling section. A coupling point is provided at the bearing element, the actuating element acting on the coupling point. The bearing element optionally has, facing the actuating element, a conical or frustoconical cutout or hole that receives a spherical or spherical-cap-shaped end section of the respective actuating element. As a result, the actuating element is centered automatically in relation to the bearing element.

In accordance with an embodiment, a lever section, is in each case arranged on the end side at the base section, wherein the coupling section is arranged centrally at the base section In this case, "on the end side" means, in particular, that the lever section is provided at an outermost edge or end section of the base section as viewed in the length direction. Optionally, two outermost lever sections are provided, wherein the coupling section is arranged centrally between these two outermost lever sections.

In accordance with an embodiment, the field facet system furthermore includes a first actuating element and a second actuating element, wherein the optical element has a first lever section, to which the first actuating element is assigned, and a second lever section, to which the second actuating element is assigned, and wherein the first actuating element and the second actuating element are supported on one another.

The number of actuating elements is arbitrary. However, at least two actuating elements are provided. Furthermore, receptacle elements are optionally provided between the actuating elements and the lever sections, the receptacle elements being provided at end sections of the actuating elements facing away from the bearing element. The receptacle elements each have, facing each actuating element, in particular a conical or frustoconical cutout or hole that receives a spherical or spherical-cap-shaped end section of the respective actuating element. As a result, the actuating elements are centered in relation to the receptacle elements.

In accordance with an embodiment, center axes of the actuating elements are arranged parallel to one another, or the center axes are in each case arranged at an angle of inclination obliquely with respect to one another.

For the case where the center axes are arranged at the angle of inclination obliquely with respect to one another, the optically effective surface in plan view is optionally curved arcuately or in a crescent-shaped fashion.

In accordance with an embodiment, the lever sections and the actuating elements are arranged alternatively as viewed along the length direction.

That is to say that there is always one lever section positioned between two actuating elements.

In accordance with an embodiment, the optically effective surface in plan view is rectangular, arcuately curved or curved in a crescent-shaped fashion.

Accordingly, in particular, the base section is also rectangular, arcuately curved or curved in a crescent-shaped fashion. In particular, the optically effective surface extends in the length direction and in the width direction. However, the optically effective surface can have any desired geometry. By way of example, the optically effective surface can also be hexagonal.

In accordance with an embodiment, the field facet system furthermore includes a strain detecting element for detecting an elastic deformation of the base section.

The strain detecting element can be designated as a strain measuring element. The strain detecting element can be fitted at the rear side of the base section, in particular adhesively bonded onto the rear side. A strain detecting element can be assigned to each actuating element. The variation of the radius of curvature can be deduced with the aid of the strain detecting element. However, the variation of the radius of curvature can also be monitored in some other way, for example optically. The strain detecting element is operatively connected to the control unit of the field facet system. The control unit, the actuating element and the strain detecting element can form a closed-loop control circuit for setting and/or altering the radius of curvature. The strain detecting element can for example include a strain gauge or be a strain gauge.

Furthermore, an optical arrangement, in particular a beam shaping and illumination system, for a lithography apparatus is proposed. The optical arrangement includes a field facet mirror including a multiplicity of such field facet systems, and a pupil facet mirror including a multiplicity of pupil facets, wherein the field facet mirror is arranged along a beam path of the optical arrangement between an intermediate focus of an EUV light source of the optical arrangement and the pupil facet mirror, wherein a plurality of pupil facets are assigned to at least one of the field facet systems, wherein the at least one field facet system is tiltable between a plurality of tilt positions in such a way that the at least one field facet system in a respective tilt position images the intermediate focus onto a pupil facet assigned to the respective tilt position, and wherein the radius of curvature of the optically effective surface of the at least one field facet system is variable in such a way that the intermediate focus in each of the tilt positions is focused onto the pupil facet assigned to the respective tilt position.

Each field facet system can be tiltable by itself into the different tilt positions. However, it is also possible for only individual field facet systems to be tiltable. In particular, an actuating element as mentioned above, in particular a Lorentz actuator, is assigned to each tiltable field facet system.

Furthermore, a lithography apparatus including such a field facet system and/or such an optical arrangement is proposed.

The lithography apparatus can include a multiplicity of such field facet systems. The lithography apparatus can be an EUV lithography apparatus or a DUV lithography apparatus. EUV stands for "extreme ultraviolet" and denotes a wavelength of the working light of between 0.1 nm and 30 nm. DUV stands for "deep ultraviolet" and denotes a wavelength of the working light of between 30 nm and 250 nm.

"A(n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

The embodiments and features described for the field facet system are correspondingly applicable to the proposed optical arrangement and to the proposed lithography apparatus, and vice versa.

Further possible implementations of the disclosure also include not explicitly mentioned combinations of features or embodiments that are described above or below with respect to the exemplary embodiments. In this case, a person skilled in the art will also add individual aspects as improvements or supplementations to the respective basic form of the disclosure.

Further configurations and aspects of the disclosure are the subject matter of the dependent claims and also of the exemplary embodiments of the disclosure described below.

BRIEF DESCRIPTION OF THE DRAWINGS

In the text that follows, the disclosure is explained in more detail on the basis of embodiments and with reference to the accompanying figures.

DETAILED DESCRIPTION

Identical elements or elements having an identical function have been provided with the same reference signs in the figures, unless indicated to the contrary. It should also be noted that the illustrations in the figures are not necessarily true to scale.

Figure 1A:
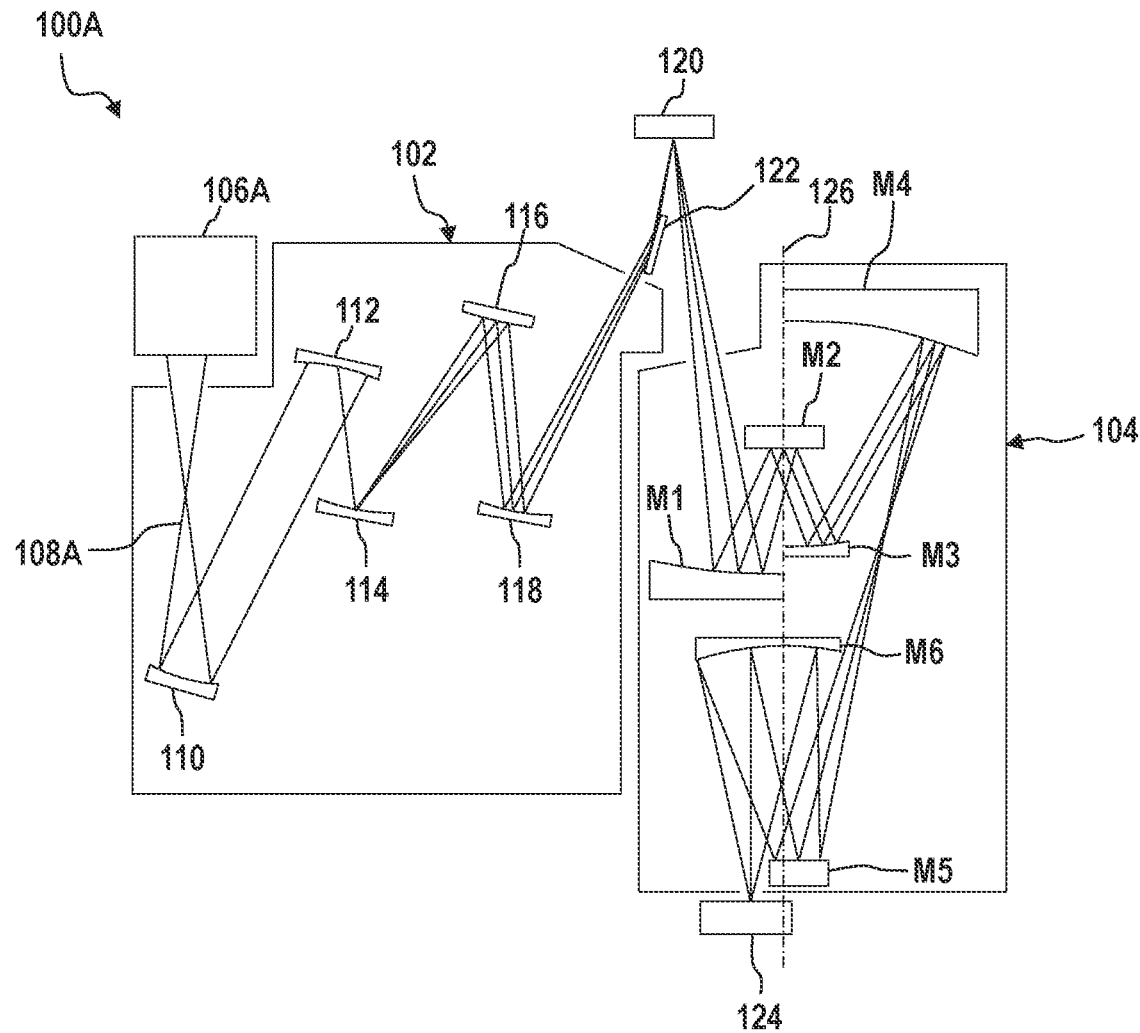
FIG. 1A shows a schematic view of one embodiment of an EUV lithography apparatus.

FIG. 1A shows a schematic view of an EUV lithography apparatus 100A, which includes a beam shaping and illumination system 102 and a projection system 104. In this case, EUV stands for "extreme ultraviolet" and denotes a wavelength of the working light of between 0.1 nm and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which drive devices for mechanically moving or setting optical elements are provided. Moreover, electrical controllers and the like can also be provided in this machine room.

The EUV lithography apparatus 100A includes an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is guided onto a photomask (called a reticle) 120. The photomask 120 is likewise embodied as a reflective optical element and can be arranged outside the systems 102, 104. Furthermore, the EUV radiation 108A can be directed onto the photomask 120 by means of a mirror 122. The photomask 120 has a structure which is imaged onto a wafer 124 or the like in a reduced fashion by means of the projection system 104.

The projection system 104 (also referred to as projection lens) has six mirrors M1 to M6 for imaging the photomask 120 onto the wafer 124. In this case, individual mirrors M1 to M6 of the projection system 104 can be arranged symmetrically in relation to an optical axis 126 of the projection system 104. It should be noted that the number of mirrors M1 to M6 of the EUV lithography apparatus 100A is not restricted to the number represented. A greater or lesser number of mirrors M1 to M6 can also be provided. Furthermore, the mirrors M1 to M6 are generally curved on their front side for beam shaping.

Figure 1B:
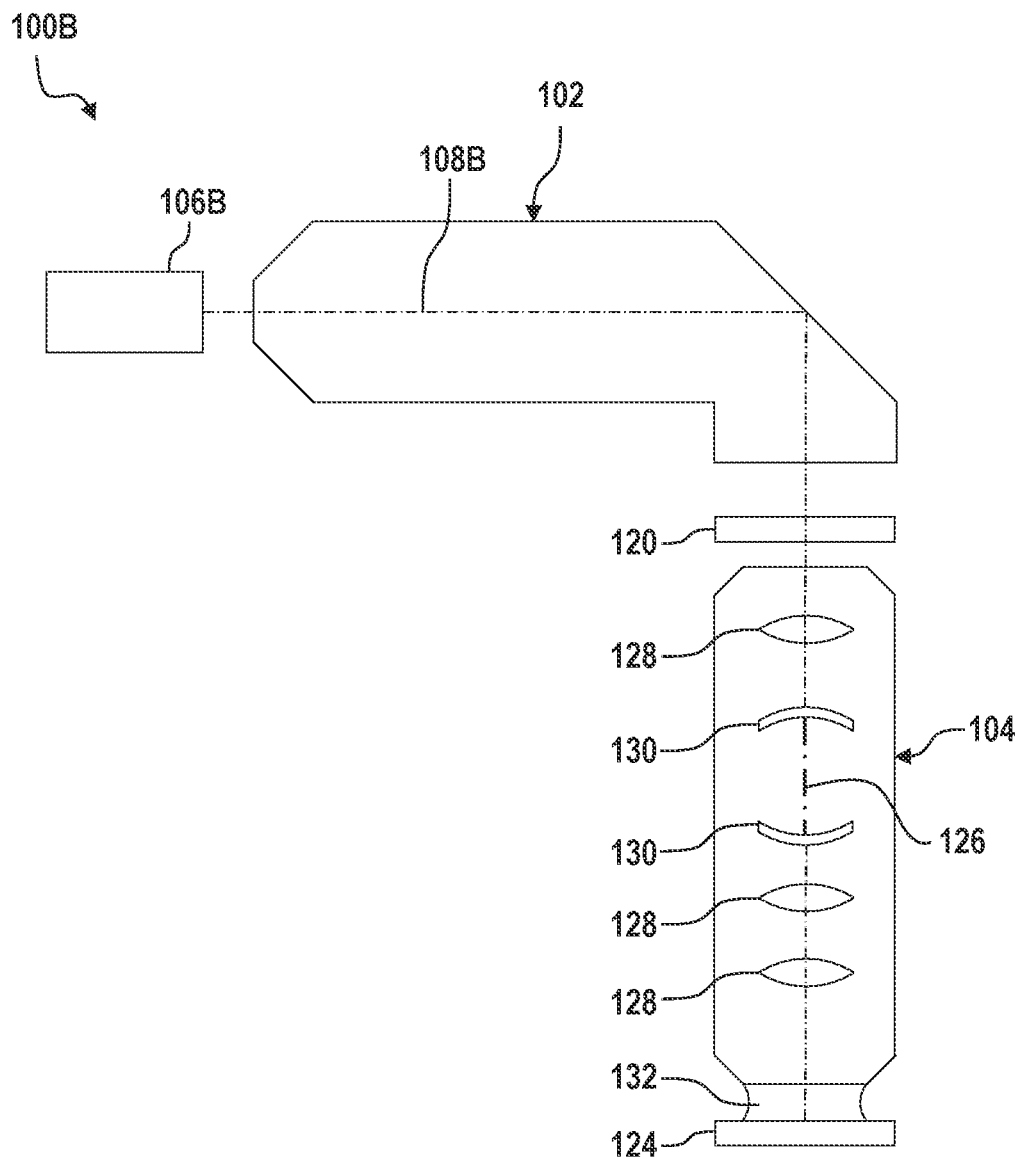
FIG. 1B shows a schematic view of one embodiment of a DUV lithography apparatus.

FIG. 1B shows a schematic view of a DUV lithography apparatus 100B, which includes a beam shaping and illumination system 102 and a projection system 104. In this case, DUV stands for "deep ultraviolet" and denotes a wavelength of the working light of between 30 and 250 nm. As has already been described with reference to FIG. 1A, the beam shaping and illumination system 102 and the projection system 104 can be surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion by means of the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements 128 and mirrors 130 of the DUV lithography apparatus 100B is not restricted to the number represented. A greater or lesser number of lens elements 128 and/or mirrors 130 can also be provided. Furthermore, the mirrors 130 are generally curved on their front side for beam shaping.

An air gap between the last lens element 128 and the wafer 124 can be replaced by a liquid medium 132 which has a refractive index of >1. The liquid medium 132 can be high-purity water, for example. Such a construction is also referred to as immersion lithography and has an increased photolithographic resolution. The medium 132 can also be referred to as an immersion liquid.

Figure 2:
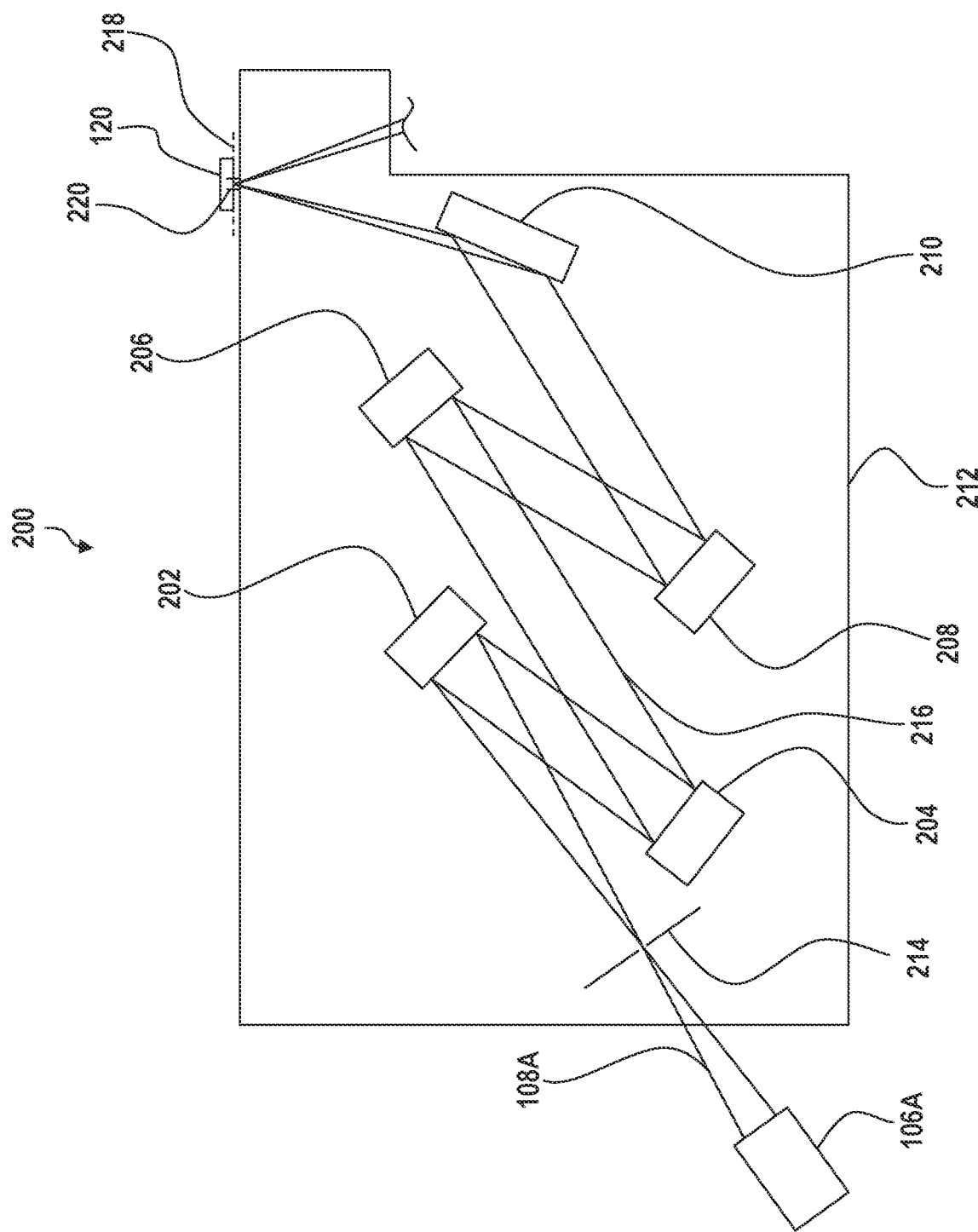
FIG. 2 shows a schematic view of one embodiment of an optical arrangement for the lithography apparatus in accordance with FIG. 1A or FIG. 1B.

FIG. 2 shows a schematic view of an optical arrangement 200. The optical arrangement 200 is a beam shaping and illumination system 102, in particular a beam shaping and illumination system 102 of an EUV lithography apparatus 100A. The optical arrangement 200 can therefore also be designated as a beam shaping and illumination system and the beam shaping and illumination system 102 can be designated as an optical arrangement. The optical arrangement 200 can be disposed upstream of a projection system 104 as explained above.

However, the optical arrangement 200 can also be part of a DUV lithography apparatus 100B. However, it is assumed below that the optical arrangement 200 is part of an EUV lithography apparatus 100A. Besides the optical arrangement 200, FIG. 2 also shows an EUV light source 106A as explained above, which emits EUV radiation 108A, and a photomask 120. The EUV light source 106A can be part of the optical arrangement 200.

The optical arrangement 200 includes a plurality of mirrors 202, 204, 206, 208. Furthermore an optional deflection mirror 210 can be provided. The deflection mirror 210 is operated with grazing incidence and can therefore also be designated as a grazing incidence mirror. The deflection mirror 210 can correspond to the mirror 122 shown in FIG. 1A. The mirrors 202, 204, 206, 208 can correspond to the mirrors 110, 112, 114, 116, 118 shown in FIG. 1A. In particular, the mirror 202 corresponds to the mirror 110, and the mirror 204 corresponds to the mirror 112.

The mirror 202 is a so-called facet mirror, in particular a field facet mirror, of the optical arrangement 200. The mirror 204 is also a facet mirror, in particular a pupil facet mirror, of the optical arrangement 200. The mirror 202 reflects the EUV radiation 108A to the mirror 204. At least one of the mirrors 206, 208 can be a condenser mirror of the optical arrangement 200. The number of mirrors 202, 204, 206, 208 is arbitrary. By way of example, it is possible to provide, as shown in FIG. 1A, five mirrors 202, 204, 206, 208, namely the mirrors 110, 112, 114, 116, 118, or, as shown in FIG. 2, four mirrors 202, 204, 206, 208. Optionally, however, at least three mirrors 202, 204, 206, 208 are provided, namely a field facet mirror, a pupil facet mirror, and a condenser mirror.

A facet mirror includes a multiplicity of lamellae or facets, which can be arranged linearly. The facets can be curved arcuately or in a crescent-shaped fashion. The facets can also be polygonal, in particular quadrilateral. By way of example, a facet mirror can have hundreds to thousands of facets. Each facet can be tiltable by itself.

The mirrors 202, 204, 206, 208 are arranged within a housing 212. The housing 212 can be subjected to a vacuum during operation, in particular during exposure operation, of the optical arrangement 200. That is to say that the mirrors 202, 204, 206, 208 are arranged in a vacuum.

During operation of the optical arrangement 200, the EUV light source 106A emits EUV radiation 108A. By way of example, a tin plasma can be produced for this purpose. In order to produce the tin plasma, a tin body, for example a tin bead or a tin droplet, can be bombarded with a laser pulse. The tin plasma emits EUV radiation 108A, which is collected with the aid of a collector, for example an ellipsoidal mirror, of the EUV light source 106A and is sent in the direction of the optical arrangement 200. The collector focuses the EUV radiation 108A at an intermediate focus 214. The intermediate focus 214 can also be designated as an intermediate focal plane or lies in an intermediate focal plane.

Upon passing through the optical arrangement 200, the EUV radiation 108A is reflected by each of the mirrors 202, 204, 206, 208 and also the deflection mirror 210. A beam path of the EUV radiation 108A is designated by the reference sign 216. The photomask 120 is arranged in an object plane 218 of the optical arrangement 200. An object field 220 is positioned in the object plane 218.

Figure 3:
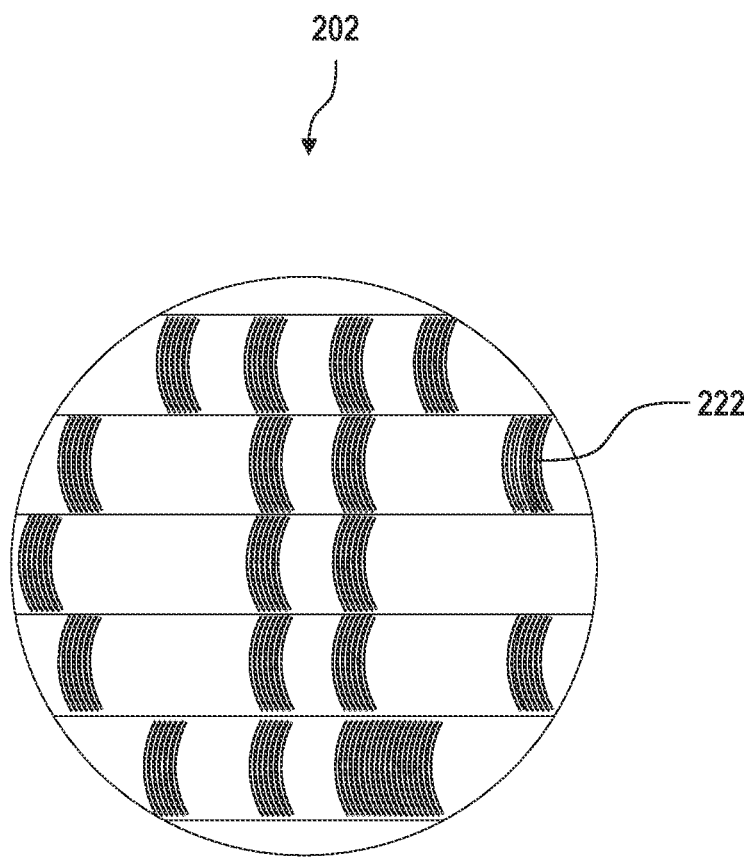
FIG. 3 shows a schematic plan view of one embodiment of a field facet mirror for the optical arrangement in accordance with FIG. 2.

FIG. 3 shows a schematic plan view of one embodiment of a mirror 202 as explained above, which mirror is embodied as a facet mirror, in particular as a field facet mirror. The facet mirror or field facet mirror is therefore designated hereinafter by the reference sign 202. The field facet mirror 202 includes a multiplicity of lamellae or facets 222 arranged linearly. The facets 222 are field facets, in particular, and are also designated as such hereinafter.

The field facets 222 can be curved arcuately or in a crescent-shaped fashion. The field facets 222 can also be polygonal, for example quadrilateral. In particular, the field facets 222 can also have an elongated rectangular geometry in each case. The field facets 222 have the shape of the field, in particular, and are therefore rectangular. Only a small number of field facets 222 are shown in FIG. 3. By way of example, the field facet mirror 202 can include hundreds to thousands of field facets 222. Each field facet 222 is tiltable by itself. For this purpose, an actuating element or an actuator can be assigned to each field facet 222. The actuator can be a so-called Lorentz actuator.

Figure 4:
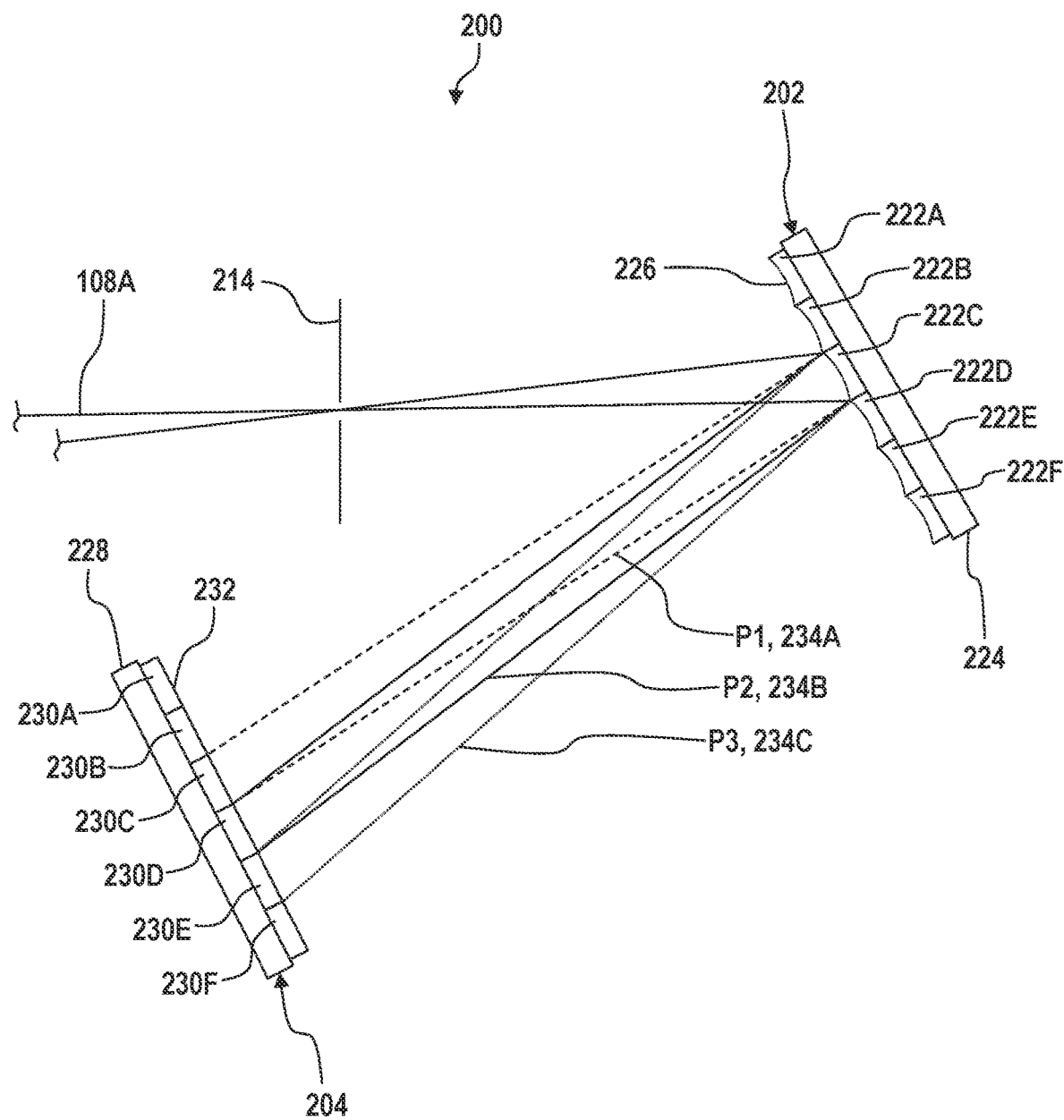
FIG. 4 shows a further schematic view of the optical arrangement in accordance with FIG. 2.

FIG. 4 shows an enlarged excerpt from the optical arrangement 200 shown in FIG. 2. The optical arrangement 200 includes the EUV light source 106A (not shown), which emits EUV radiation 108A, the intermediate focus 214, the field facet mirror 202 and also the mirror 204 embodied as a pupil facet mirror. The mirror 204 is designated hereinafter as a pupil facet mirror. The mirrors 206, 208, the deflection mirror 210 and the housing 212 are not shown in FIG. 4. The pupil facet mirror 204 is arranged at least approximately in an entrance pupil plane of the projection system 104 or a conjugate plane with respect thereto.

The intermediate focus 214 is an aperture stop of the EUV light source 106A. For the sake of simplicity, the description hereinafter does not draw a distinction between the aperture stop for producing the intermediate focus 214 and the actual intermediate focus, that is to say the opening in the aperture stop.

The field facet mirror 202 includes a carrier body or main body 224, which—as mentioned above—carries a multiplicity of field facets 222A, 222B, 222C, 222D, 222E, 222F. The field facets 222A, 222B, 222C, 222D, 222E, 222F can be embodied identically, but can also differ from one another, in particular in the shape of their boundary and/or a curvature of a respective optically effective surface 226. The optically effective surface 226 is a mirror surface. The optically effective surface 226 serves to reflect the EUV radiation 108A in the direction towards the pupil facet mirror 204. In FIG. 4, only the optically effective surface 226 of the field facet 222A is provided with the reference sign. However, the field facets 222B, 222C, 222D, 222E, 222F likewise have such optically effective surfaces 226. The optically effective surface 226 can be designated as a field facet surface.

Only the field facet 222C is discussed below. However, all explanations concerning the field facet 222C also apply to the field facets 222A, 222B, 222D, 222E, 222F. Accordingly, only that part of the EUV radiation 108A which impinges on the field facet 222C is illustrated. However, the entire field facet mirror 202 is illuminated with the aid of the EUV light source 106A.

The pupil facet mirror 204 includes a carrier body or main body 228, which carries a multiplicity of pupil facets 230A, 230B, 230C, 230D, 230E, 230F. Each of the pupil facets 230A, 230B, 230C, 230D, 230E, 230F has an optically effective surface 232, in particular a mirror surface. In FIG. 4, only the optically effective surface 232 of the pupil facet 230A is provided with a reference sign. The optically effective surface 232 is suitable for reflecting EUV radiation 108A. The optically effective surface 226 can be designated as a field facet surface.

For switching over between different pupils, the field facet 222C can be switched over between different pupil facets 230A, 230B, 230C, 230D, 230E, 230F. In particular, for this purpose, the pupil facets 230C, 230D, 230E are assigned to the field facet 222C. This involves tilting the field facet 222C. This tilting is effected mechanically by 25 to 40 mrad, such that the EUV radiation 108 is deflected by 50 to 80 mrad in accordance with the condition that the angle of incidence is equal to the angle of reflection. This angle indication relates to a half-angle, that is to say measured from the center to the edge rather than from one (left) edge to the other (right) edge.

The field facet 222C—as mentioned above—is tiltable with the aid of an actuator (not illustrated), for example with the aid of a Lorentz actuator, between a plurality of positions or tilt positions P1, P2, P3. In a first tilt position P1, the field facet 222C images the intermediate focus 214 onto the pupil facet 230C with an imaging light beam 234A (illustrated by dashed lines). In a second tilt position P2, the field facet 222C images the intermediate focus 214 onto the pupil facet 230D with an imaging light beam 234B (illustrated by solid lines). In a third tilt position P3, the field facet 222C images the intermediate focus 214 onto the pupil facet 230E with an imaging light beam 234C (illustrated by dotted lines). The respective pupil facet 230C, 230D, 230E images the field facet 222C onto the photomask 120 (not illustrated here) or in proximity thereto.

In each of the tilt positions P1, P2, P3, the imaging light beam 234A, 234B, 234C irradiates a portion of the optically effective surfaces 232 of the pupil facets 230C, 230D, 230E assigned to the respective tilt position P1, P2, P3. The effect of switching over between the tilt positions P1, P2, P3 and irradiating the optically effective surfaces 232 of the pupil facets 230C, 230D, 230E is described in greater detail below with reference to FIGS. 5 and 6.

Figure 5:
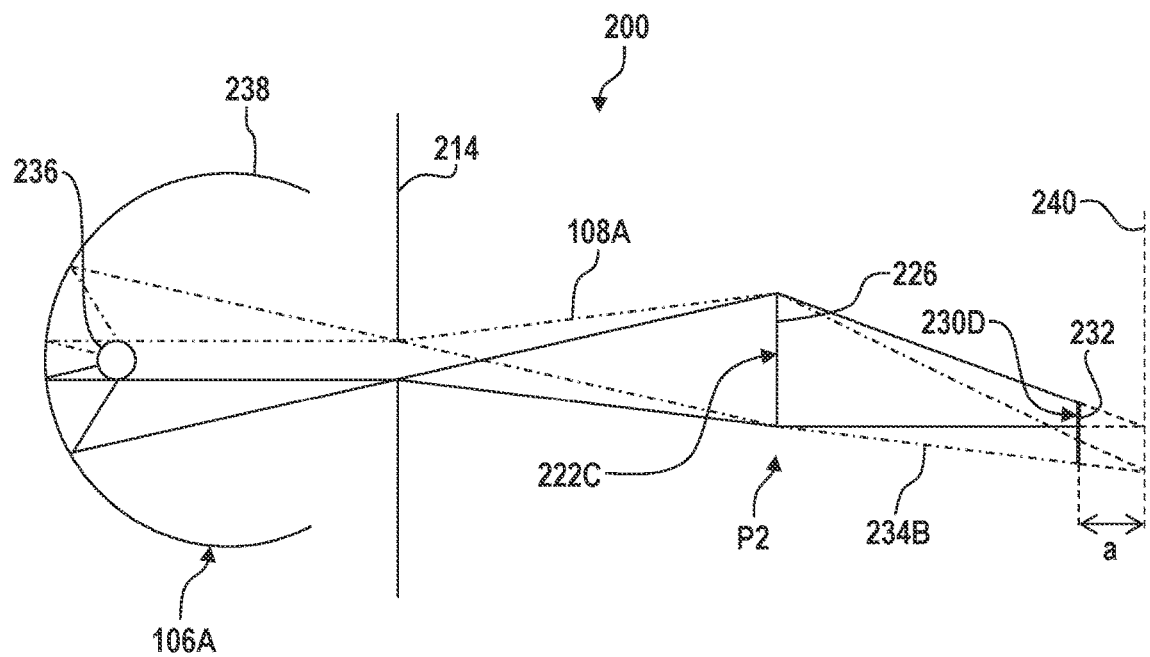
FIG. 5 shows a further schematic view of the optical arrangement in accordance with FIG. 2.
Figure 6:
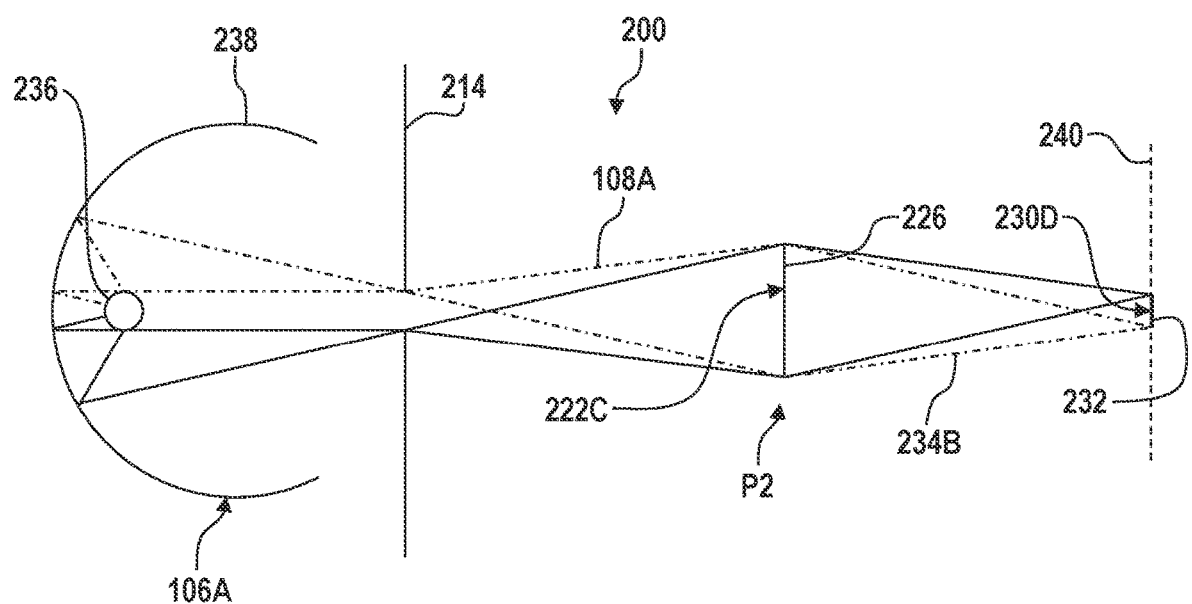
FIG. 6 shows a further schematic view of the optical arrangement in accordance with FIG. 2.

FIGS. 5 and 6 show further illustrations of the optical arrangement 200 in accordance with FIG. 4. In FIGS. 5 and 6, the EUV light source 106A, the intermediate focus 214, the field facet 222C and the pupil facet 230D are illustrated in a line to facilitate the illustration. In actual fact, however, as shown in FIG. 2, they are thus arranged at specific angles with respect to one another. FIG. 5 shows the field facet 222C in its tilt position P2, wherein a curvature of the optically effective surface 226 was not altered and, in particular, was not adapted to the tilt position P2. As illustrated in FIGS. 5 and 6, the EUV light source 106A includes a plasma source 236 for generating the EUV radiation 108A and a collector 238 for focusing the EUV radiation 108A. The intermediate focus 214 and the pupil facet 230D are typically round.

The field facet 222C projects an image of the intermediate focus 214 onto the pupil facet 230D with the imaging light beam 234B. However, the optically effective surface 232 of the pupil facet 230D does not correspond exactly to an imaging surface 240 in which the image of the intermediate focus 214 is perfectly focused. Instead, the optically effective surface 232 of the pupil facet 230D in FIG. 5 is nearer to the field facet 222C than the imaging surface 240, such that the imaging of the intermediate focus 214 onto the pupil facet 230D with the imaging light beam 234B is not focused. There is a distance a between the optically effective surface 232 of the pupil facet 230D and the imaging surface 240.

This defocusing gives rise to a limitation in the reduction of the degree of pupil filling. However, achieving ever higher resolutions of EUV lithography optical units can involve further reducing the degree of pupil filling. In the case of a defocused image of the intermediate focus 214 on one of the pupil facets 230A, 230B, 230C, 230D, 230E, 230F, it can be desirable to make the pupil facet larger than actually necessary, as a result of which a larger area of the pupil facet mirror 204, that is to say a larger illuminated area, is illuminated. The ratio of irradiated area relative to the entire optically effective surface 232 of the pupil facets 230A, 230B, 230C, 230D, 230E, 230F of the pupil facet mirror 204 (that is to say to the area that can be maximally accommodated by the EUV lithography apparatus 100A), is designated as the "degree of pupil filling". Usually, small unfilled regions, in particular regions that are smaller than the area of a pupil facet, within an otherwise filled region are concomitantly included in the calculation of the degree of pupil filling.

Figure 7:
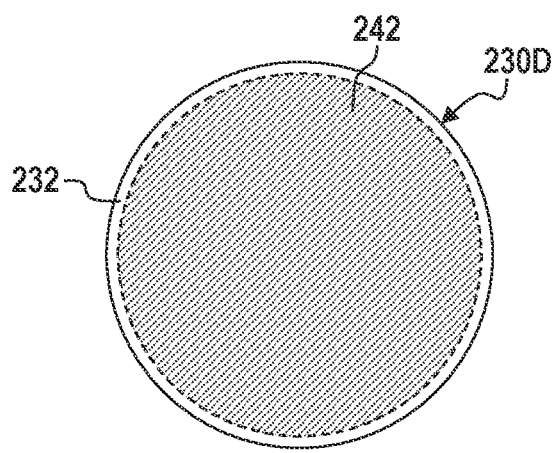
FIG. 7 shows a schematic view of one embodiment of a pupil facet of a pupil facet mirror for the optical arrangement in accordance with FIG. 2.
Figure 8:
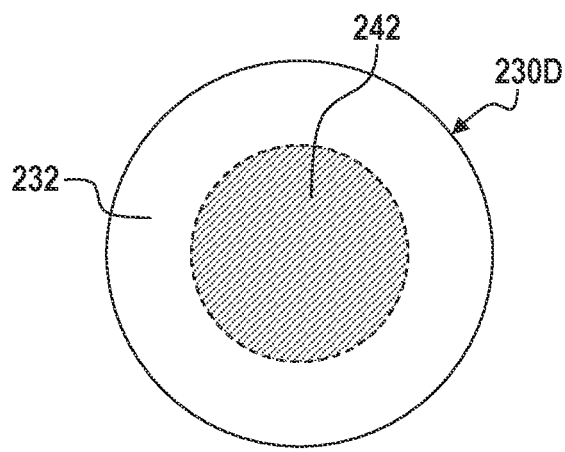
FIG. 8 shows a further schematic view of the pupil facet mirror in accordance with FIG. 7.
Figure 9:
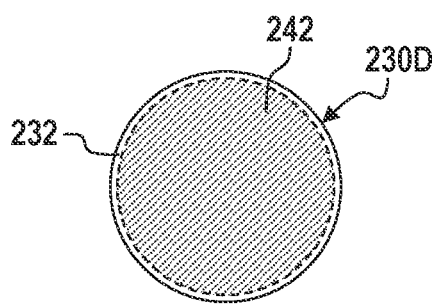
FIG. 9 shows a schematic view of a further embodiment of a pupil facet of a pupil facet mirror for the optical arrangement in accordance with FIG. 2.

This non-focused image is characterized by the fact that an area 242 irradiated by the imaging light beam 234B, the area being illustrated in a hatched manner in FIGS. 7 to 9, is relatively large. This is owing to the fact that the curvature of the optically effective surface 226 of the field facet 222C was not optimized. FIG. 7 shows a plan view of the optically effective surface 232 of the pupil facet 230D. The optically effective surface 232 is substantially round or hexagonal.

Consequently, the pupil facet 230D is also optionally round or hexagonal. The area 242 of the optically effective surface 232 of the pupil facet 230D that is irradiated by the imaging light beam 234B corresponds, in terms of its extents, approximately to the optically effective surface 232 itself. The irradiated area 242 thus covers almost the entire optically effective surface 232 of the pupil facet 230D.

FIG. 6 shows the field facet 222C in the tilt position P2 after an alteration of the curvature of the optically effective surface 226. In FIG. 6, the curvature of the optically effective surface 226 was changed in such a way that the distance a between the optically effective surface 232 and the imaging surface 240 is reduced. In FIG. 6, the distance a is zero, such that the optically effective surface 232 and the imaging surface 240 lie one above the other. The imaging of the intermediate focus 214 onto the pupil facet 230D with the imaging light beam 234B is perfectly focused in FIG. 6 and the irradiated area 242 is significantly reduced in terms of its extents—as shown in FIG. 8—by comparison with the irradiated area 242 in FIG. 7.

FIG. 8 shows a further plan view of the optically effective surface 232 of the pupil facet 230D. As illustrated in FIG. 8, the irradiated area 242 is significantly reduced by comparison with the irradiated area 242 illustrated in FIG. 7 before the alteration of the curvature of the optically effective surface 226 of the field facet 222C.

As shown in a further plan view in FIG. 9, the possibility is afforded of reducing the size of the pupil facets 230A, 230B, 230C, 230D, 230E, 230F and packing them more closely. The resolution of the EUV lithography apparatus 100A can be increased as a result. The reduced optically effective surface 232 of the pupil facets 230A, 230B, 230C, 230D, 230E, 230F is round or hexagonal. The irradiated area 242 illustrated in a hatched manner is identical to that in FIG. 8 in terms of its extents, but fills a large portion of the optically effective surface 232 of the pupil facet 230D illustrated in FIG. 9. The optimization of the curvature of the optically effective surface 226 of the field facet 222C thus makes it possible to reduce the size of the pupil facet 230D.

A description is given below of how the curvature of the curved optically effective surface 226 of the field facet 222C is altered in order always to achieve a focusing onto the respective pupil facet 230C, 230D, 230E and/or in order to reduce the irradiated area 242, as explained above.

Figure 10:
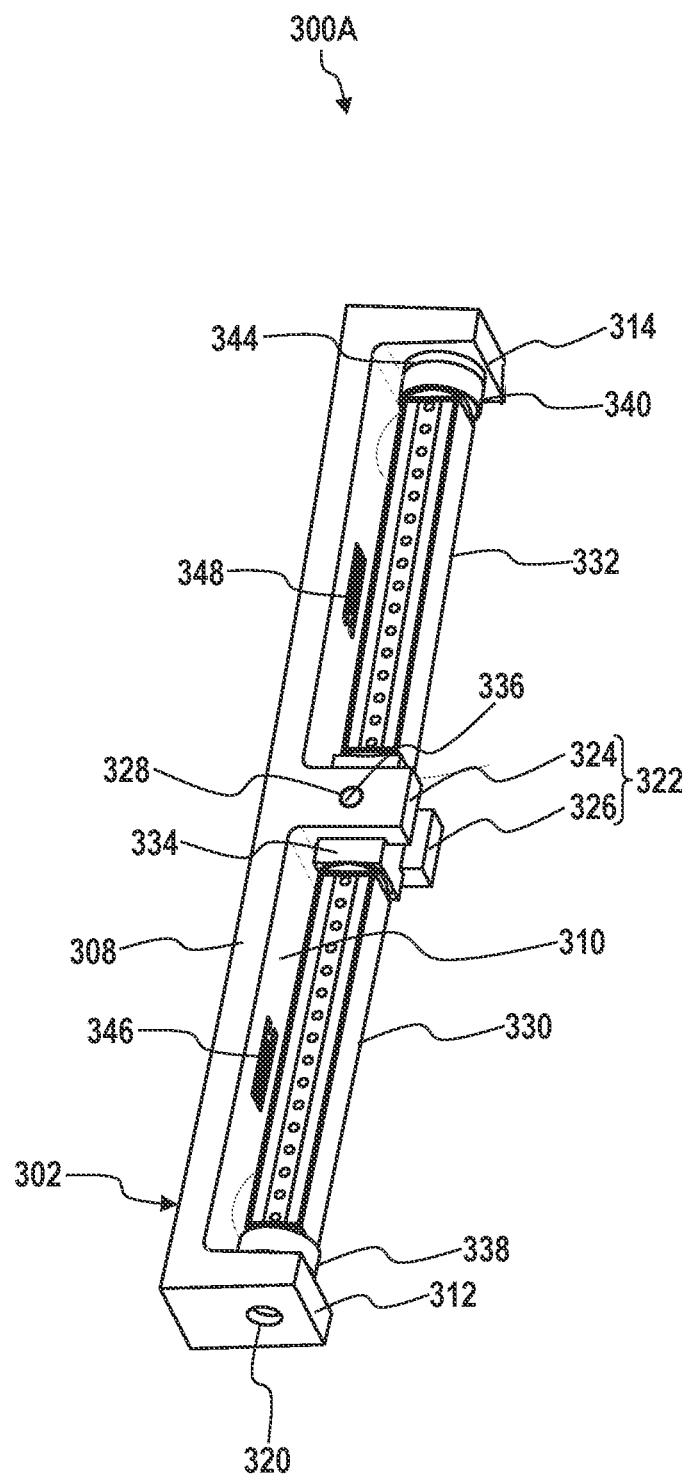
FIG. 10 shows a schematic perspective view of one embodiment of an optical system for the optical arrangement in accordance with FIG. 2.
Figure 11:
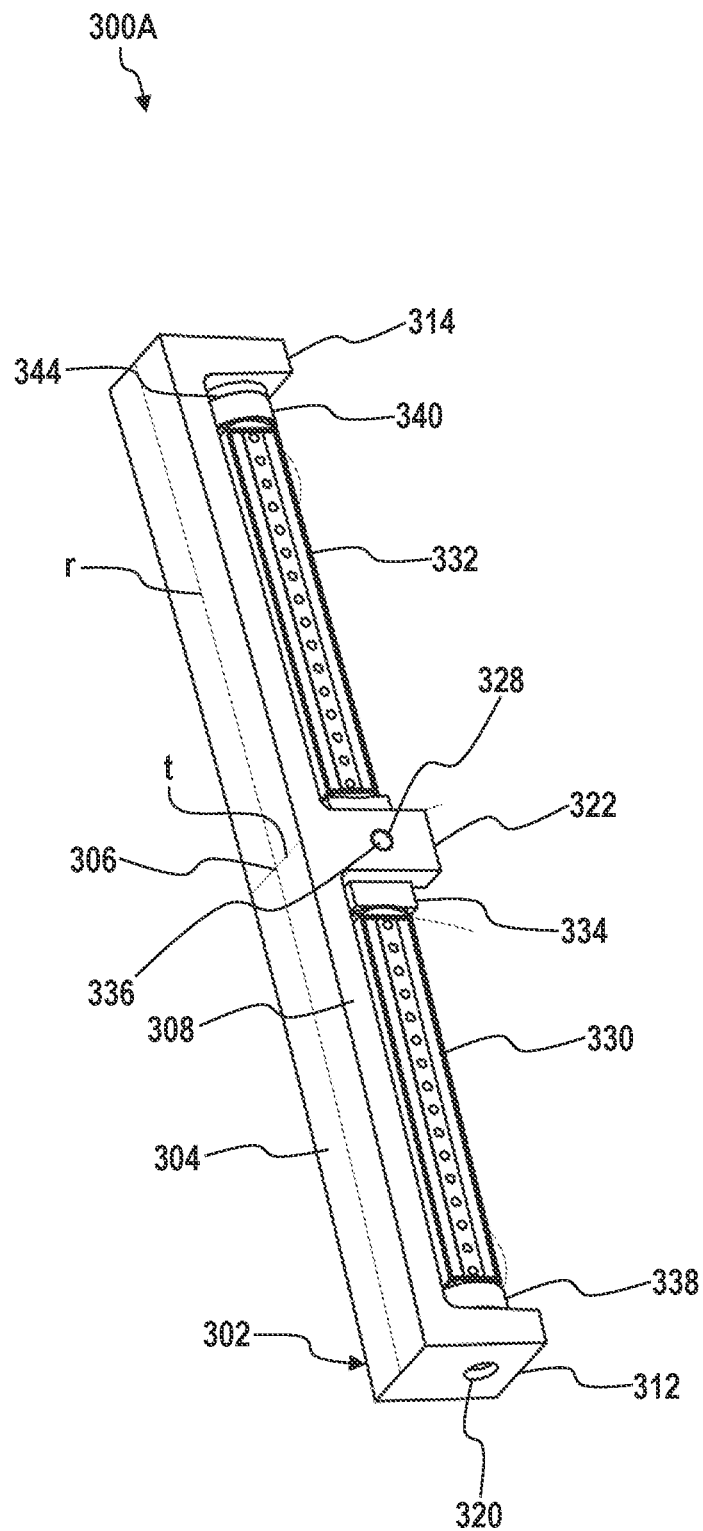
FIG. 11 shows a further schematic perspective view of the optical system in accordance with FIG. 10.

FIG. 10 shows a schematic perspective view of one embodiment of an optical system 300A. FIG. 11 shows a further schematic perspective view of the optical system 300A.

Figure 12:
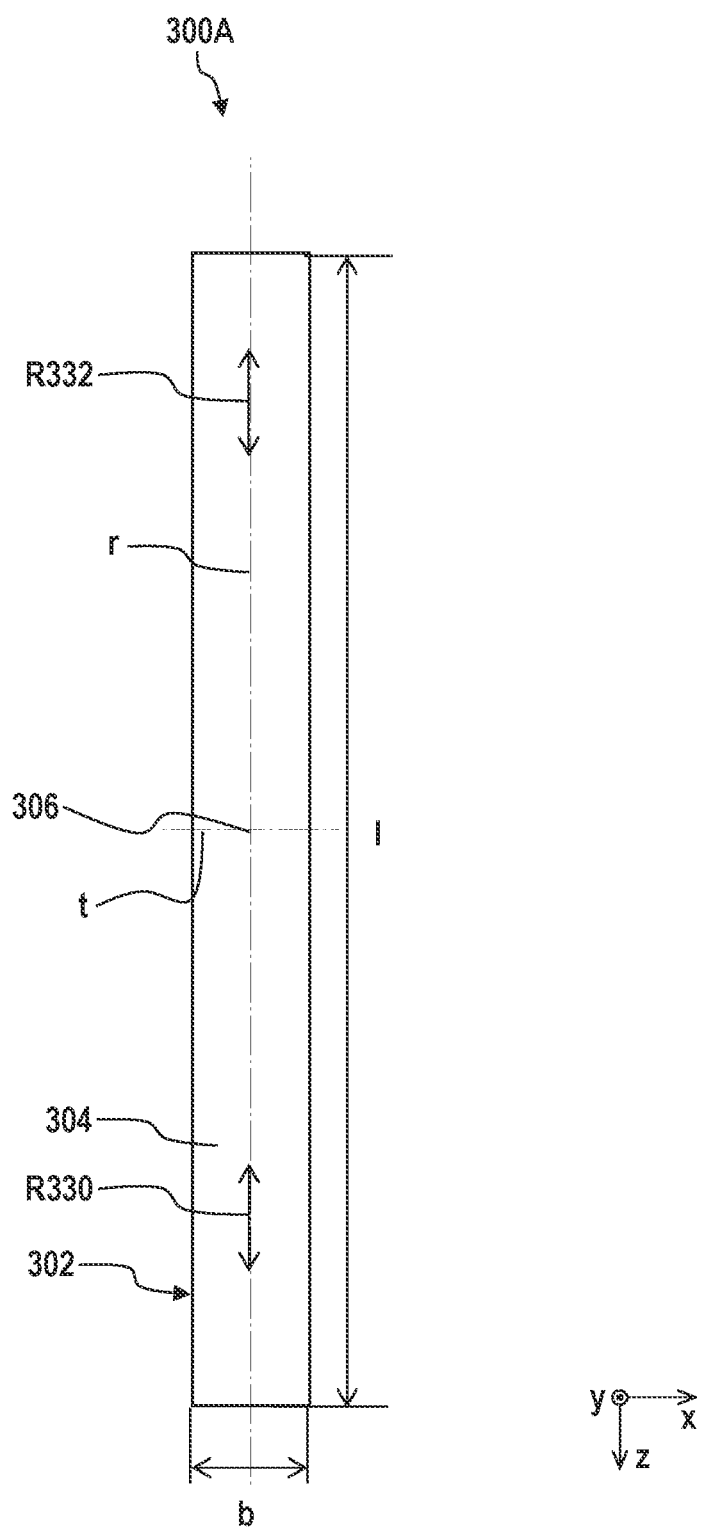
FIG. 12 shows a schematic plan view of the optical system in accordance with FIG. 10.
Figure 13:
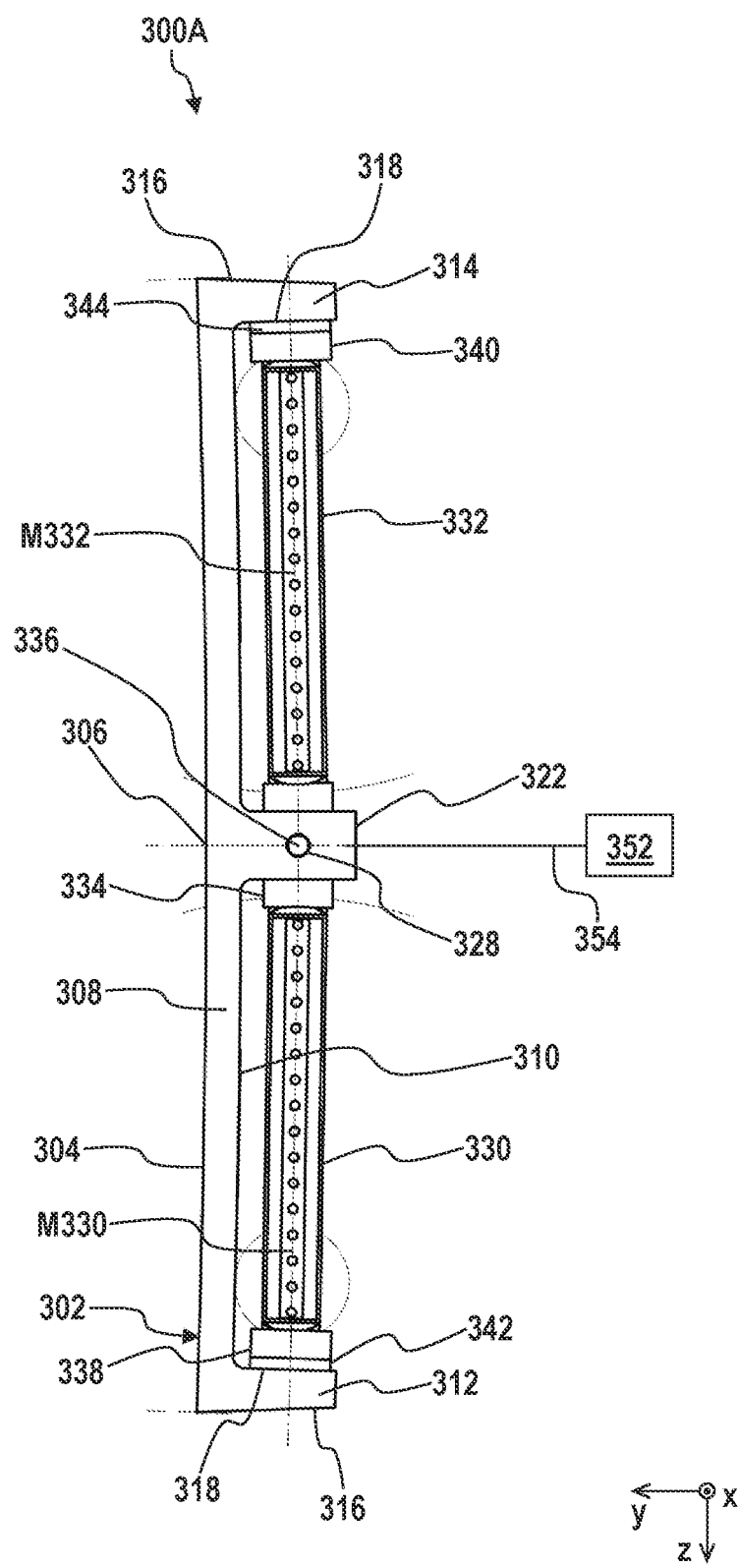
FIG. 13 shows a schematic side view of the optical system in accordance with FIG. 10.
Figure 14:
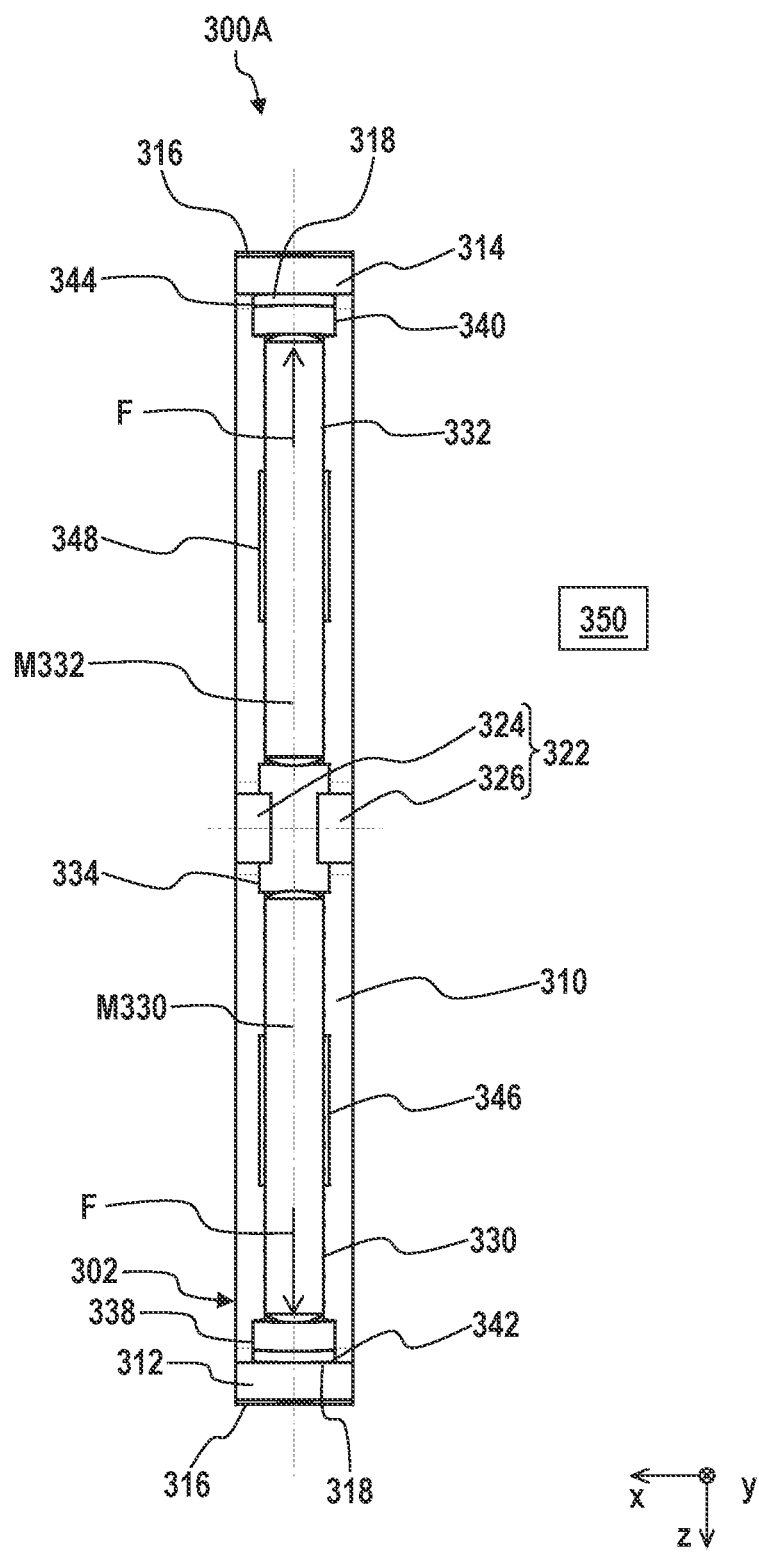
FIG. 14 shows a schematic bottom view of the optical system in accordance with FIG. 10.

FIG. 12 shows a schematic plan view of the optical system 300A. FIG. 13 shows a schematic side view of the optical system 300A. FIG. 14 shows a schematic bottom view of the optical system 300A. FIGS. 10 to 14 are discussed at the same time hereinafter.

The optical system 300A is part of an optical arrangement 200 as explained above. In particular, the optical arrangement 200 can include a multiplicity of such optical systems 300A. The optical system 300A is, in particular, also part of a field facet mirror 202 as explained above. The optical system 300A is a field facet 222A, 222B, 222C, 222D, 222E, 222F as explained above. The optical system 300A can therefore also be designated as a field facet, field facet system or field facet device. The optical system 300A is optionally a field facet system. Hereinafter, however, the field facet system is designated as optical system 300A.

A coordinate system having a first spatial direction or x-direction x, a second spatial direction or y-direction y and a third spatial direction or z-direction z is assigned to the optical system 300A. The spatial directions x, y, z are positioned perpendicularly to one another.

The optical system 300A includes an optical element 302. The optical element 302 is produced from a mirror substrate or substrate. The substrate can include in particular copper, in particular a copper alloy, an iron-nickel alloy, such as Invar, for example, silicon or some other suitable material. The substrate is responsible for the mechanical properties of the optical element 302. An optically effective surface 304 is provided on the front side at the optical element 302. The optically effective surface 304 corresponds to the optically effective surface 226 in accordance with FIG. 4. The optically effective surface 304 is a mirror surface. The optically effective surface 304 can be produced with the aid of a coating. The optically effective surface 304 can be applied as a coating to the substrate. A polishing layer can be provided between the substrate and the optically effective surface 304. The optical element 302 is a mirror facet or can be designated as such.

The optical element 302 or the optically effective surface 304 has an extent of 50 to 150 mm by 4 to 15 mm. That is to say that the optically effective surface 304 has a length l of 50 to 150 mm and a width b of 4 to 15 mm. The optically effective surface 304 is rectangular. The length l is oriented along the z-direction z. Therefore, the z-direction z can also be designated as the length direction. The width b is oriented along the x-direction x. Therefore, the x-direction x can also be designated as the width direction.

The exact dimensions depend on the geometry of the beam shaping and illumination system 102 or the optical arrangement 200. In other words, the dimensions of the optically effective surface 304 are dependent on the distances between the field facet mirror 202, the pupil facet mirror 204 and the photomask 120. However, the aspect ratio (l:b) of the optically effective surface 304 is optionally approximately 10:1. That is to say that, as the extent of the optically effective surface 304, 50 mm by 4 mm is just as suitable as 150 mm by 15 mm. However, the aspect ratio can also be 5:1 to 20:1.

The optically effective surface 304 has an average radius of curvature r of approximately 1000 to 1500 mm depending on the system geometry. The optically effective surface 304 is not spherical, however, but rather tonic. That is to say that the optically effective surface 304 has a different radius of curvature along the z-direction z (long extent) by comparison with along the x-direction x (short extent). In other words, the optically effective surface 304 includes a long or first radius of curvature r (along the z-direction z) and a short or second radius of curvature t. The difference between the two radii of curvature r, t, that is to say the astigmatism, is 50 to 100 mm. By way of example, the radius of curvature r along the z-direction z can be 1500 mm, whereas the radius of curvature t along the x-direction x is 1450 mm.

As already mentioned in the introduction, it is not absolutely necessary for the axes of the optically effective surface 304, namely the radii of curvature r, t, to correspond to the axes of the optical element 302, namely the x-direction and the z-direction z. By way of example, the radii of curvature r, t could be rotated by 10 to 20° with respect to one another in an unactuated state of the optical system 300A.

The shape of the optically effective surface 304 can be a torus or an ellipsoid. For the relevant field facet geometries and radii of curvature r, t, the difference between a torus and an ellipsoid is so small, however, that it has no practical effect at all. For the case where a toroidal geometry is provided, the latter has a vertex 306.

The optical element 302 includes a rod-shaped base section 308, at which the optically effective surface 304 is provided on the front side. A rear side 310 is provided facing away from the optically effective surface 304. The rear side 310 is optically inactive. Marginally a first lever section 312 and a second lever section 314 extend from the rear side 310. Each lever section 312, 314 has an outer surface 316 and an inner surface 318. The outer surfaces 316 of the two lever sections 312, 314 face away from one another. The inner surfaces 318 of the two lever sections 312, 314 face one another. The inner surfaces 318 can be oriented perpendicularly to the rear side 310. The outer surfaces 316 can be oriented obliquely with respect to the rear side 310. Each lever section 312, 314 can be perforated by a perforation 320. The perforation 320 can be a drilled hole.

Furthermore, a coupling section 322 arranged centrally between the lever sections 312, 314 extends from the rear side 310. The coupling section 322 can include two coupling regions 324, 326 arranged next to one another in the x-direction x. A perforation 328 runs through the coupling section 322 and thus also through the coupling regions 324, 326. The perforation 328 can be a drilled hole. A midpoint of the perforation 328 can be positioned below the vertex 306 as viewed in the y-direction y. That is to say that the vertex 306 and the midpoint of the perforation 328 are arranged at the same level in the z-direction z.

The base section 308, the lever sections 312, 314 and the coupling section 322 with its two coupling regions 324, 326 can be embodied in one piece, in particular materially in one piece. In the present case, "in one piece" or "integrally" means that the base section 308, the lever sections 312, 314 and the coupling section 322 together form a common component, namely the optical element 302. In this case, "materially in one piece" means that the optical element 302—with the exception of the coating used for producing the optically effective surface 304—is produced from the same material throughout. The optical element 302 is thus a monolithic component.

Besides the optical element 302, the optical system 300A includes at least one actuating element 330, 332 arranged between the lever sections 312, 314. Optionally, a first actuating element 330 and a second actuating element 332 are provided. Particularly optionally, more than two actuating elements 330, 332 are provided. In particular, at least three actuating elements 330, 332 (not shown) are provided. However, it is also possible—as is explained below—for exactly two actuating elements 330, 332 to be provided. An axis of symmetry or center axis M330, M332 is assigned to each actuating element 330, 332. The actuating elements 330, 332 are arranged such that the center axes M330, M332 are arranged coaxially. The actuating elements 330, 332 are displacement actuators. A "displacement actuator" should be understood to mean an actuating element which, in contrast to the force actuator, does not predefine a fixed force, but rather a displacement. A "force actuator", by contrast, should be understood to mean an actuating element which, in contrast to a displacement actuator, does not predefine a fixed displacement, but rather a force. One example of a displacement actuator is a piezoelement. One example of a force actuator is a Lorenz actuator as already mentioned above.

However, it is also possible to provide only one actuating element 330, 332—continuous between the lever sections 312, 314. The actuating elements 330, 332 can also be designated as actuators. The actuating elements 330, 332 optionally include piezoelements or a piezostack. The actuating elements 330, 332 can therefore also be designated as piezoactuating elements or piezoactuators.

The actuating elements 330, 332 are suitable for effecting a change in length along their longitudinal direction, that is to say along the z-direction z, and thus exerting a force on the lever sections 312, 314. In FIG. 12, a respective direction of effect of the actuating elements 330, 332 or of the force exerted by the actuating elements 330, 332 is provided with reference signs R330, R332.

A bearing element 334 is provided between the actuating elements 330, 332. The bearing element 334 is cylindrical with a rectangular base surface or parallelepipedal and is received at least in sections in the coupling section 322 or between the coupling regions 324, 326. The bearing element 334 has, facing each actuating element 330, 332, a conical or frustoconical cutout or drilled hole, which receives a spherical or spherical-cup-shaped end section of the respective actuating element 330, 332. As a result, the actuating elements 330, 332 are centered in relation to the bearing element 334.

The coupling regions 324, 326 engage around the bearing element 334 in a positively locking manner. A positively locking connection arises as a result of at least two connection partners, in this case the bearing element 334 and the coupling regions 324, 326, engaging into or behind one another. Furthermore, the bearing element 334 is fixed with the aid of a bolt 336 received in the perforation 328. For this purpose, a corresponding perforation is provided in the bearing element 334. Consequently, the bearing element 334 is fixed in all three directions x, y, z with the aid of the coupling regions 324, 326 and the bolt 336.

Furthermore, the optical system 300A includes receptacle elements 338, 340 provided at end sections of the actuating elements 330, 332 facing away from the bearing element 334. The receptacle elements 338, 340 each have, facing each actuating element 330, 332, a conical or frustoconical cutout or hole that receives a spherical or spherical-cap-shaped end section of the respective actuating element 330, 332. As a result, the actuating elements 330, 332 are centered in relation to the receptacle elements 338, 340. The receptacle elements 338, 340 can have a pin-shaped securing section, which is respectively received in the perforations 320 of the lever sections 312, 314. Optional shims 342, 344 are provided between the receptacle elements 338, 340 and the lever sections 312, 314. The shims 342, 344 allow the actuating elements 330, 332 to be mounted under prestress.

The optical system 300A includes strain detecting elements 346, 348. The number of strain detecting elements 346, 348 is arbitrary. Optionally, a first strain detecting element 346 is assigned to the first actuating element 330. Accordingly, a second strain detecting element 348 is assigned to the second actuating element 332. However, it is also possible for only one strain detecting element 346, 348 to be provided. The strain detecting elements 346, 348 can be adhesively bonded onto the rear side 310. The strain detecting elements 346, 348 are strain gauges or include strain gauges.

The optical system 300A includes a control unit 350, which is shown only in FIG. 14. The control unit 350 is suitable for receiving and evaluating signals, in particular sensor signals, of the strain detecting elements 346, 348. Moreover, the control unit 350 is suitable for driving the actuating elements 330, 332, such that the latter respectively exert an actuating force F on the lever sections 312, 314. In this case, the actuating elements 330, 332 are supported on one another with the aid of the bearing element 334. The control unit 350 is coupled to the strain detecting elements 346, 348 and the actuating elements 330, 332 with the aid of cablings (not shown).

Furthermore, the optical system 300A includes a further actuating element 352. The actuating element 352 can likewise be designated as an actuator. However, in contrast to the actuating elements 330, 332, the actuating element 352 is not a displacement actuator, but rather a force actuator. With the aid of the actuating element 352, the optical element 302 together with the actuating elements 330, 332 can be tilted into the tilt positions P1, P2, P3 explained above. The actuating element 352 can be a so-called Lorentz actuator or include a Lorentz actuator. The actuating element 352 can include a plunger 354, which is fixedly connected to the coupling section 322. A permanent magnet can be provided at an end of the plunger 354 facing away from the coupling section 322, which permanent magnet is able to be manipulated with the aid of coils (not shown) of the actuating element 352 in order to tilt the optical element 302 into the different tilt positions P1, P2, P3.

The functionality of the optical system 300A is explained below. As mentioned above, after the optical element 302 has been brought from one of the tilt positions P1, P2, P3 into another of the tilt positions P1, P2, P3, it may be desirable to alter the first radius of curvature r. For this purpose, with the aid of the control unit 350, the actuating elements 330, 332 are energized, such that they respectively apply the actuating force F to the lever sections 312, 314. The actuating forces F act along the respective center axis M330, M332 of the actuating elements 330, 332. The lever sections 312, 314 act as lever arms, whereby the base section 308 is subjected to a bending moment on both sides. As a result, the base section 308 deforms elastically from an undeformed state shown in FIGS. 10 to 14 to a deformed state (not shown). The first radius of curvature r is smaller in the deformed state than in the undeformed state.

With the aid of the strain detecting elements 346, 348, the deformation of the base section 308 can be deduced and the first radius of curvature r can be adapted further, if desired. A continuously variable adjustment of the first radius of curvature r is thus possible. Optionally, the base section 308 is spring-pretensioned in the undeformed state, such that when the actuating elements 330, 332 are not energized, the base section 308 automatically deforms back from the deformed state to the undeformed state. With the aid of the adjustment of the first radius of curvature r, the defocusing mentioned above can be reduced or totally eliminated.

Figure 15:
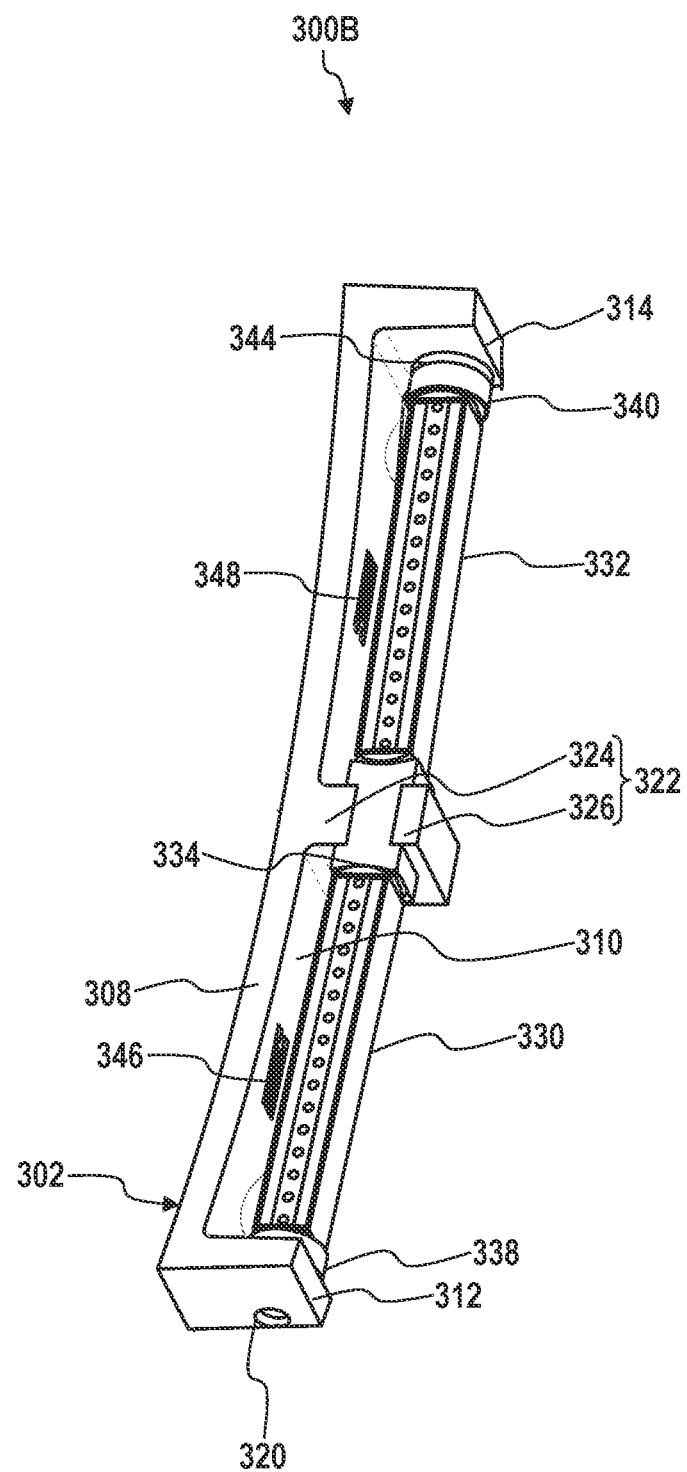
FIG. 15 shows a schematic perspective view of a further embodiment of an optical system for the optical arrangement in accordance with FIG. 2.
Figure 16:
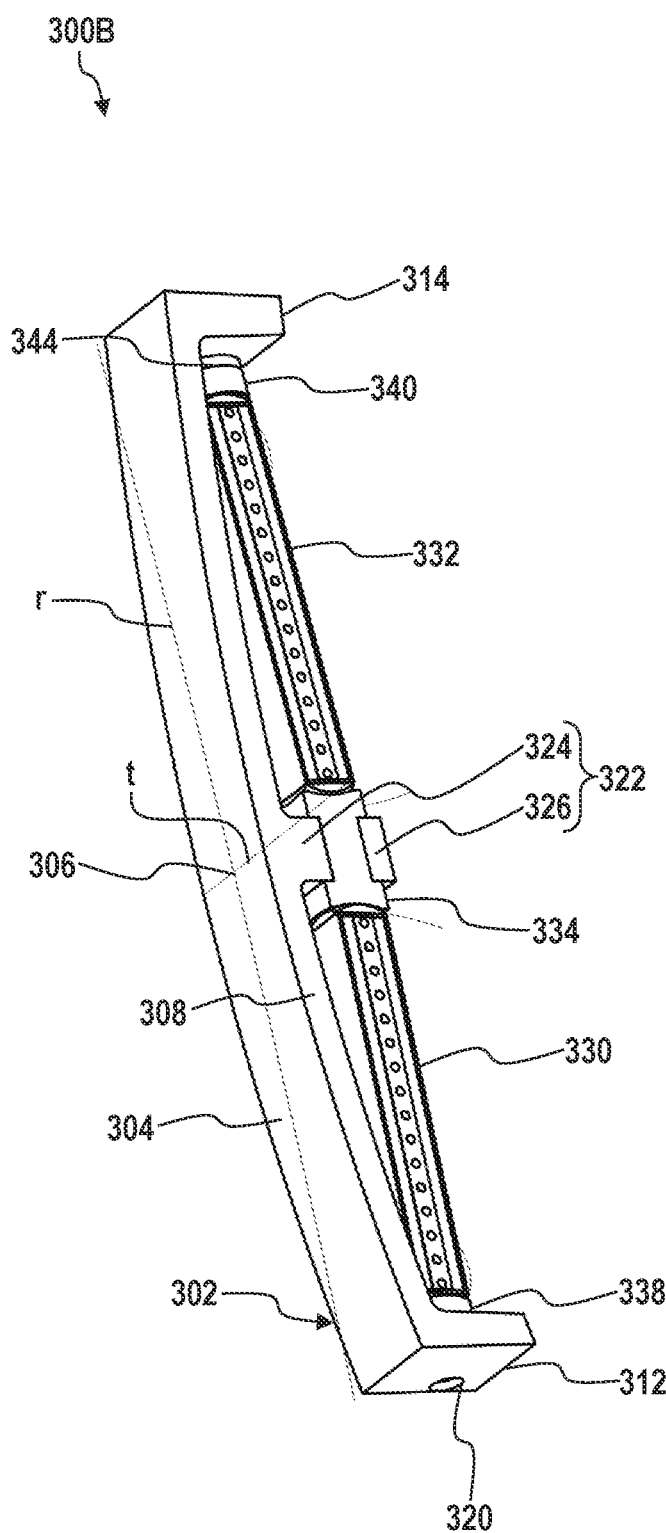
FIG. 16 shows a further schematic perspective view of the optical system in accordance with FIG. 15.
Figure 17:
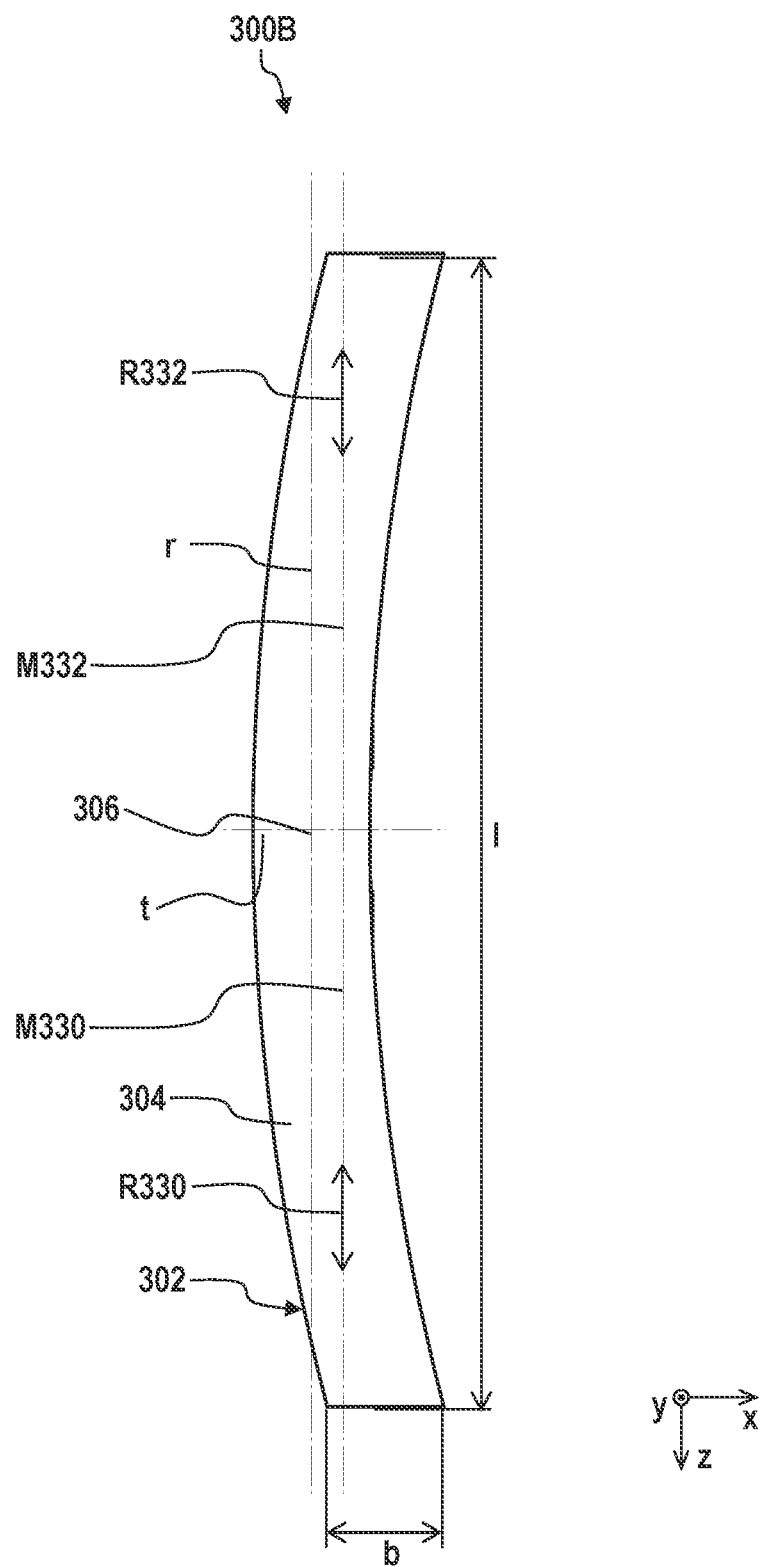
FIG. 17 shows a schematic plan view of the optical system in accordance with FIG. 15.
Figure 18:
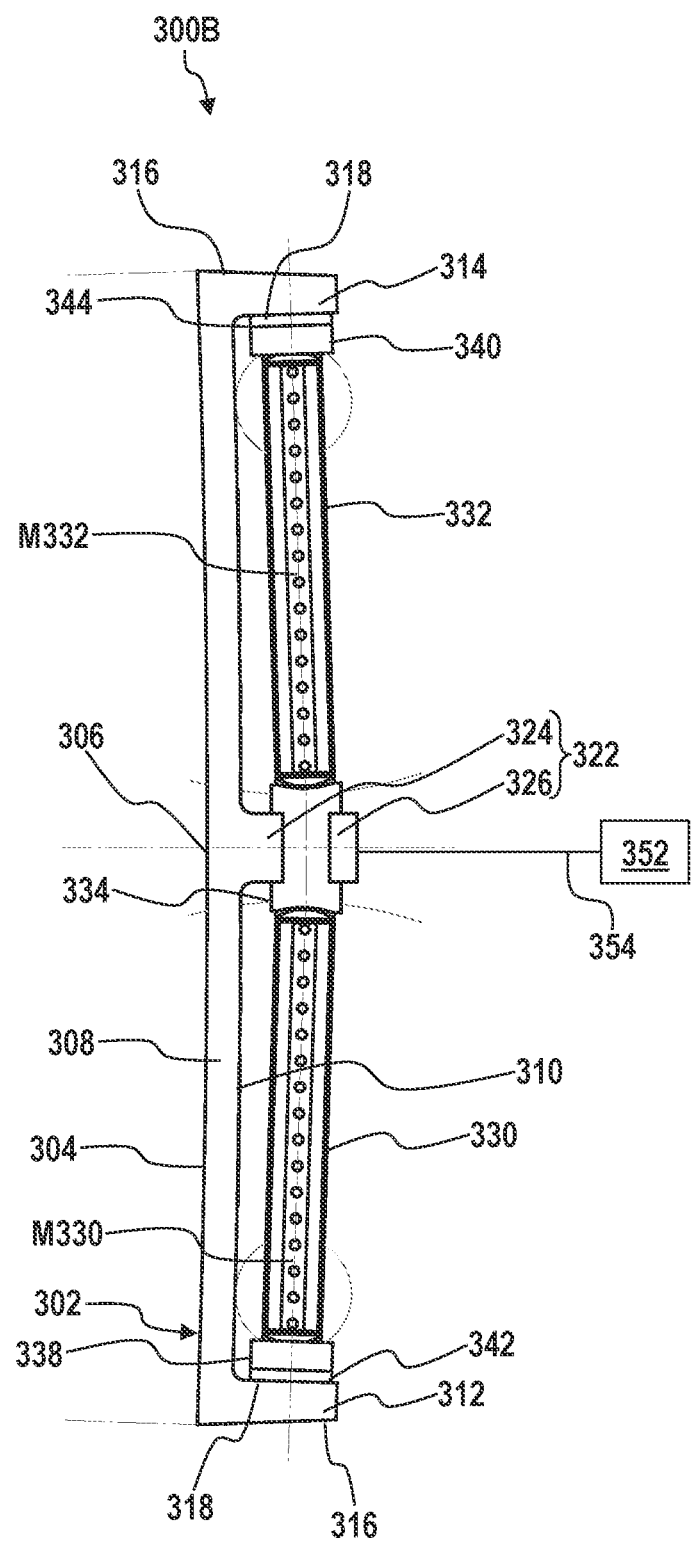
FIG. 18 shows a schematic side view of the optical system in accordance with FIG. 15.
Figure 19:
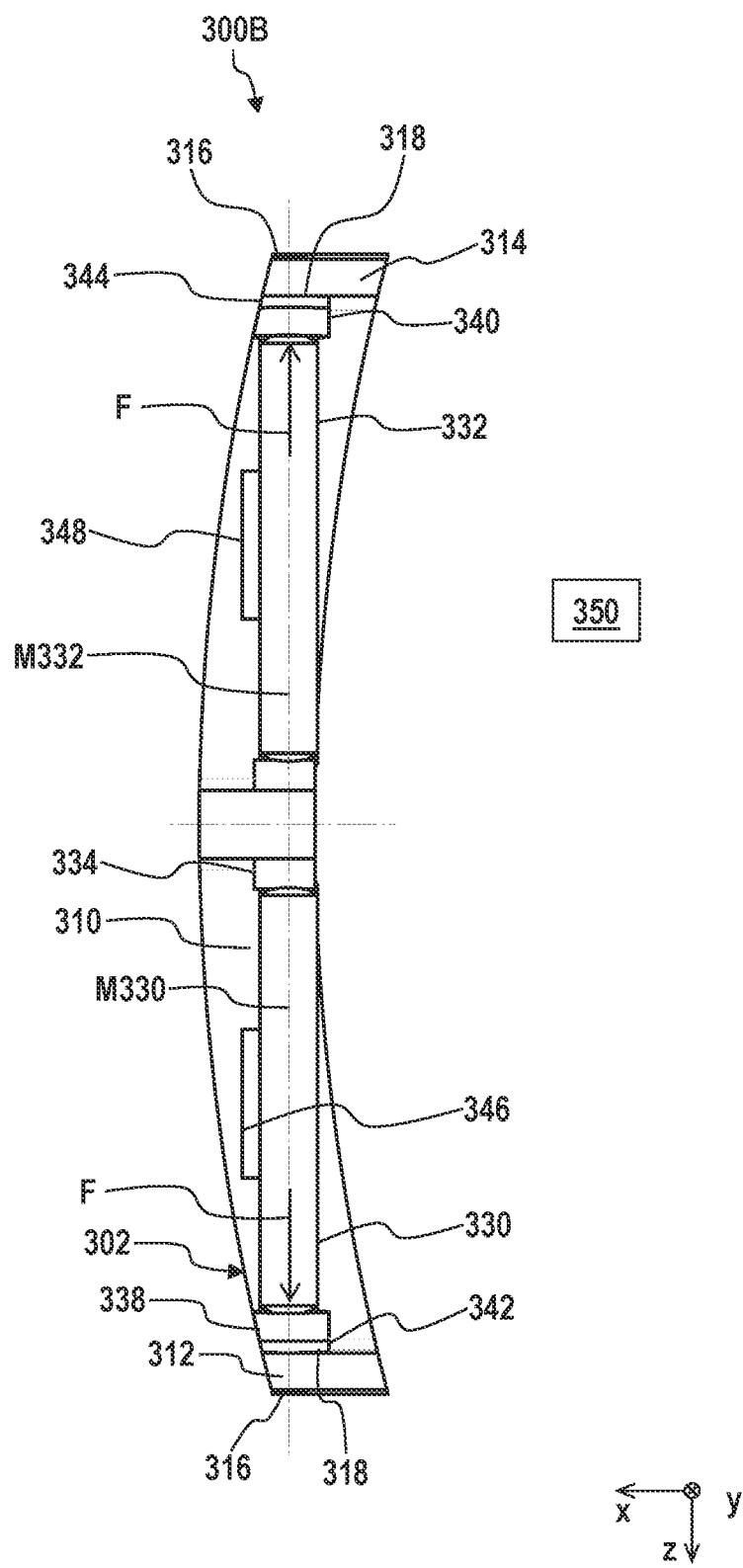
FIG. 19 shows a schematic bottom view of the optical system in accordance with FIG. 15.

FIG. 15 shows a schematic perspective view of a further embodiment of an optical system 300B. FIG. 16 shows a further schematic perspective view of the optical system 300B. FIG. 17 shows a schematic plan view of the optical system 300B. FIG. 18 shows a schematic side view of the optical system 300B. FIG. 19 shows a schematic bottom view of the optical system 300B. FIGS. 15 to 19 are discussed at the same time hereinafter.

The optical system 300B differs from the optical system 300A merely in that the optical element 302 or the optically effective surface 304 thereof is not rectangular, but rather curved arcuately or in a crescent-shaped fashion.

Figure 20:
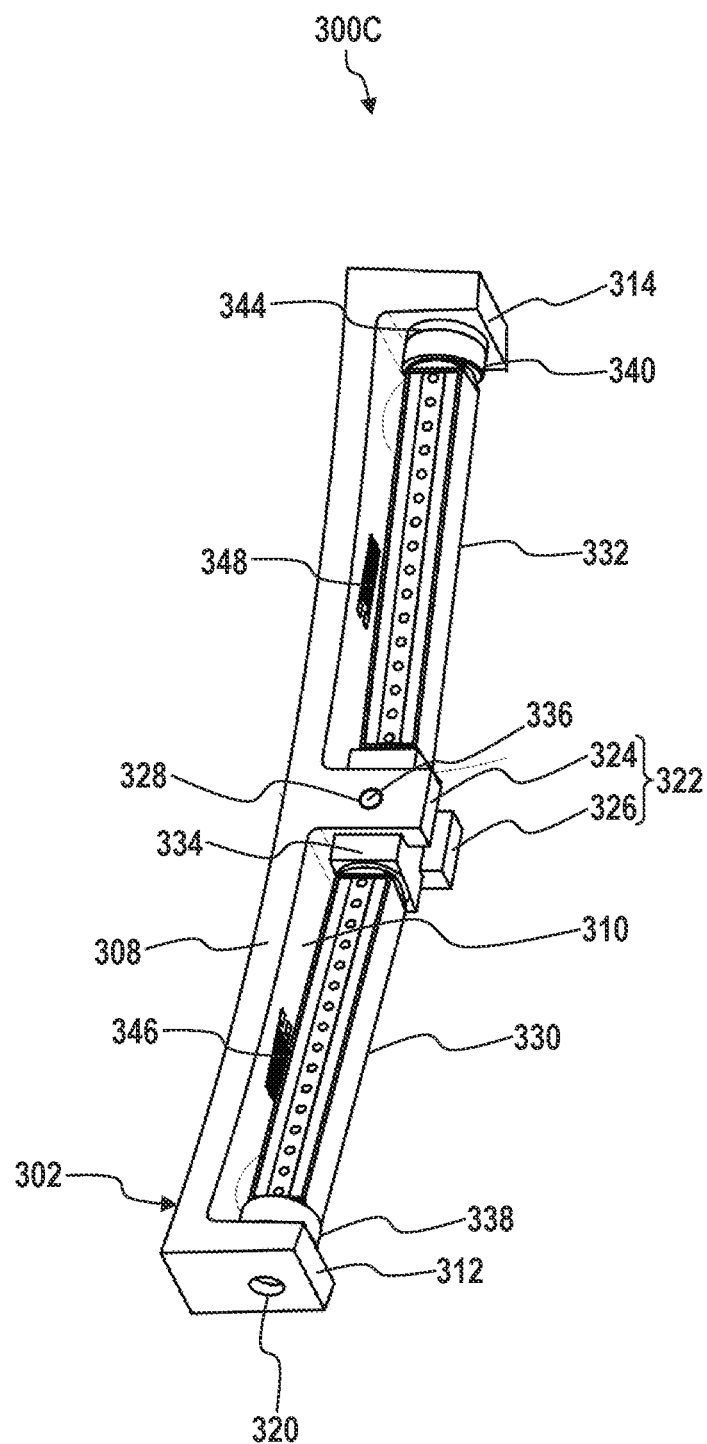
FIG. 20 shows a schematic perspective view of a further embodiment of an optical system for the optical arrangement in accordance with FIG. 2.
Figure 21:
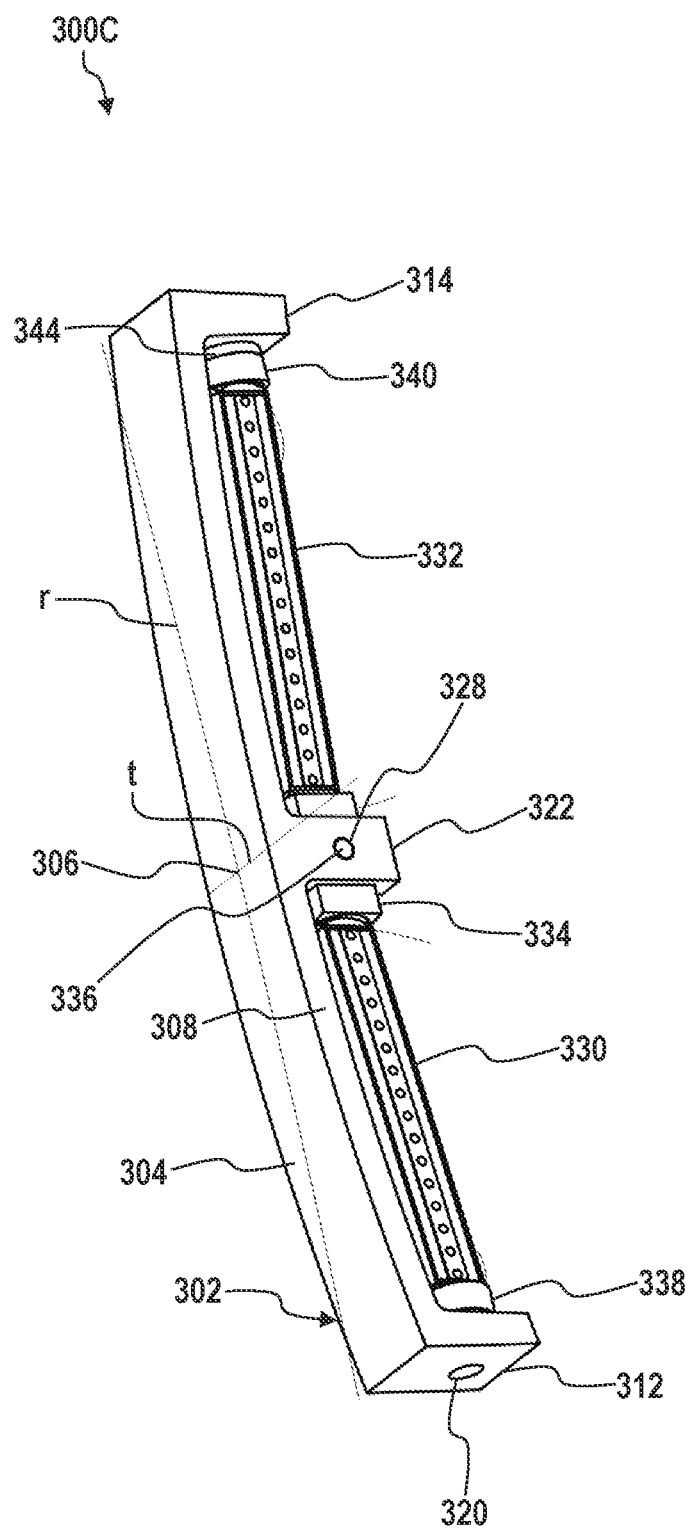
FIG. 21 shows a further schematic perspective view of the optical system in accordance with FIG. 20.
Figure 22:
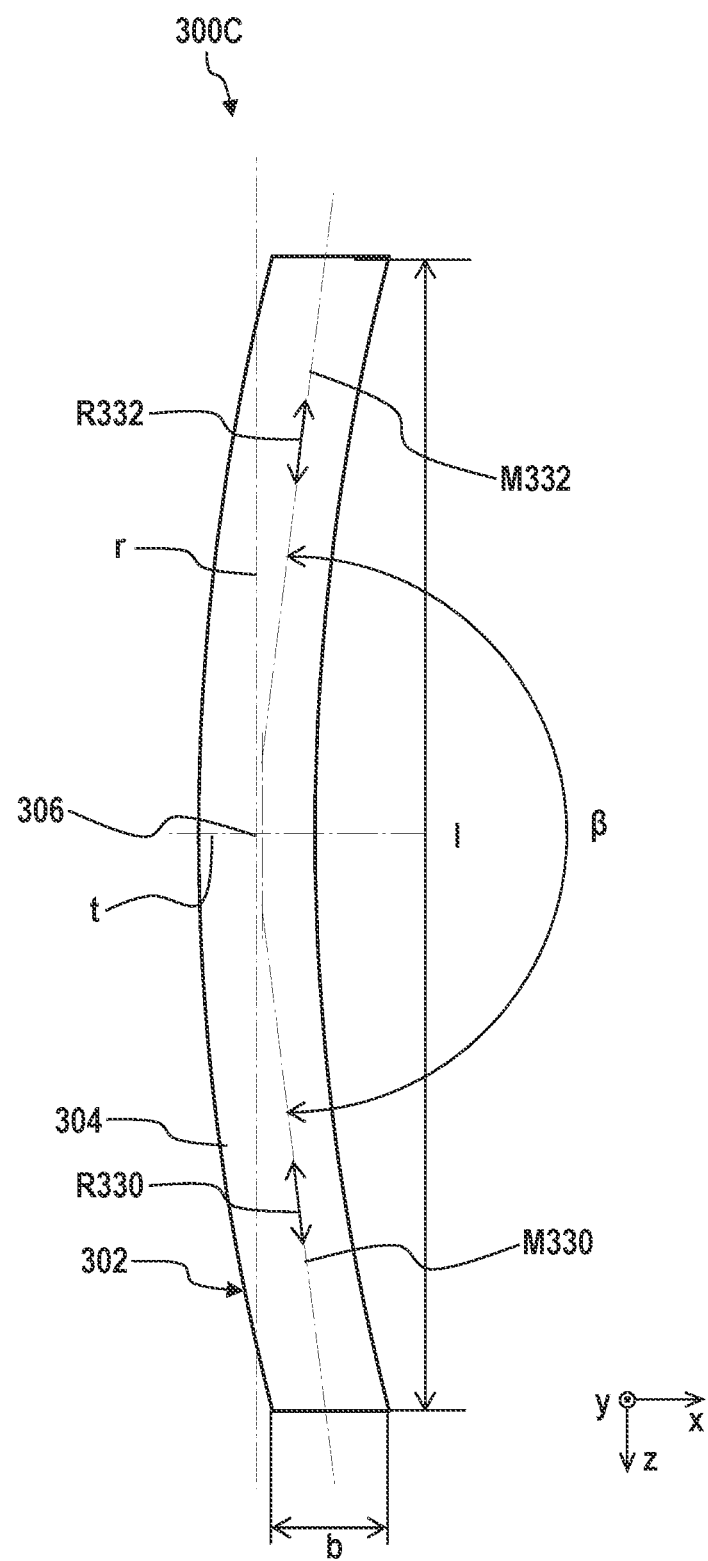
FIG. 22 shows a schematic plan view of the optical system in accordance with FIG. 20.
Figure 23:
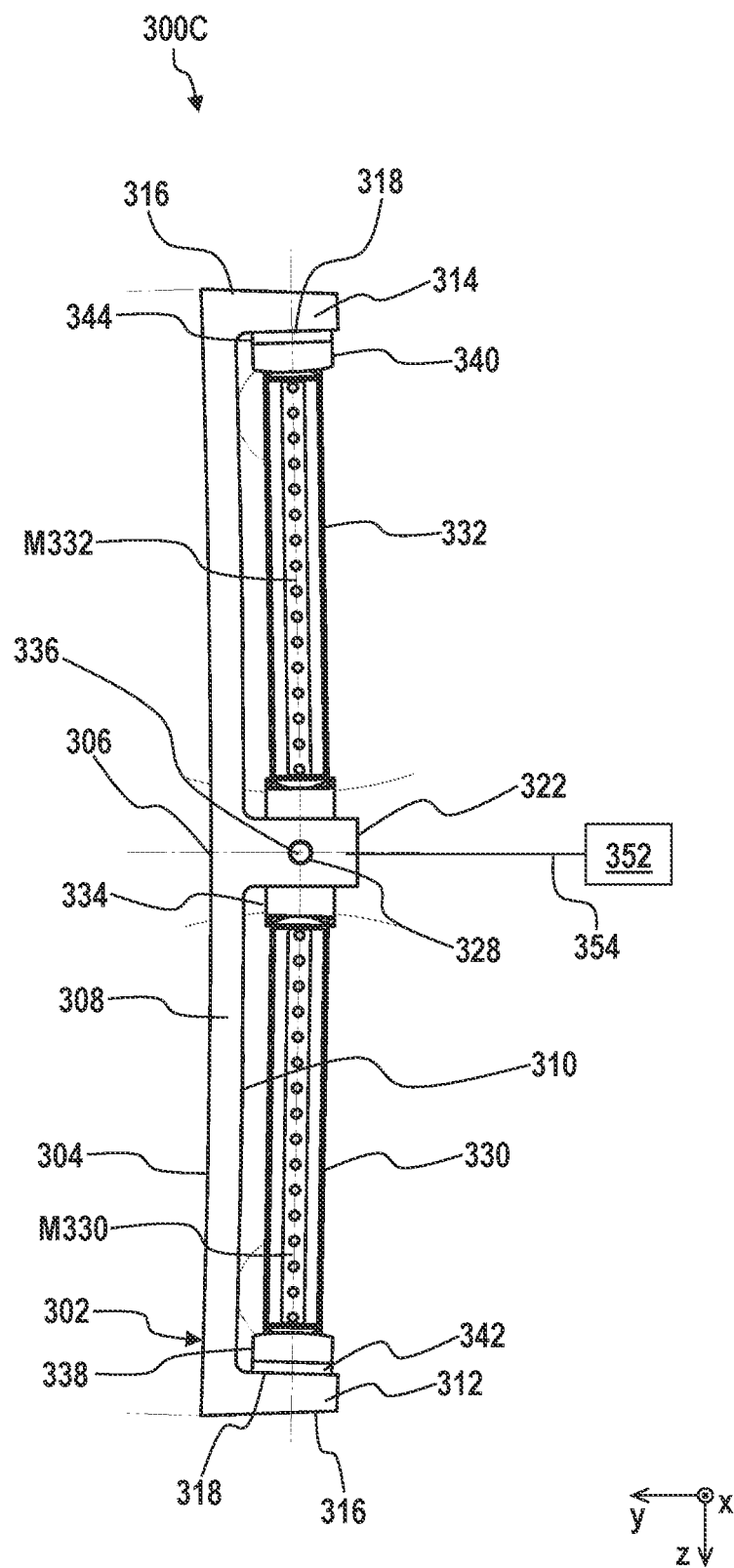
FIG. 23 shows a schematic side view of the optical system in accordance with FIG. 20.
Figure 24:
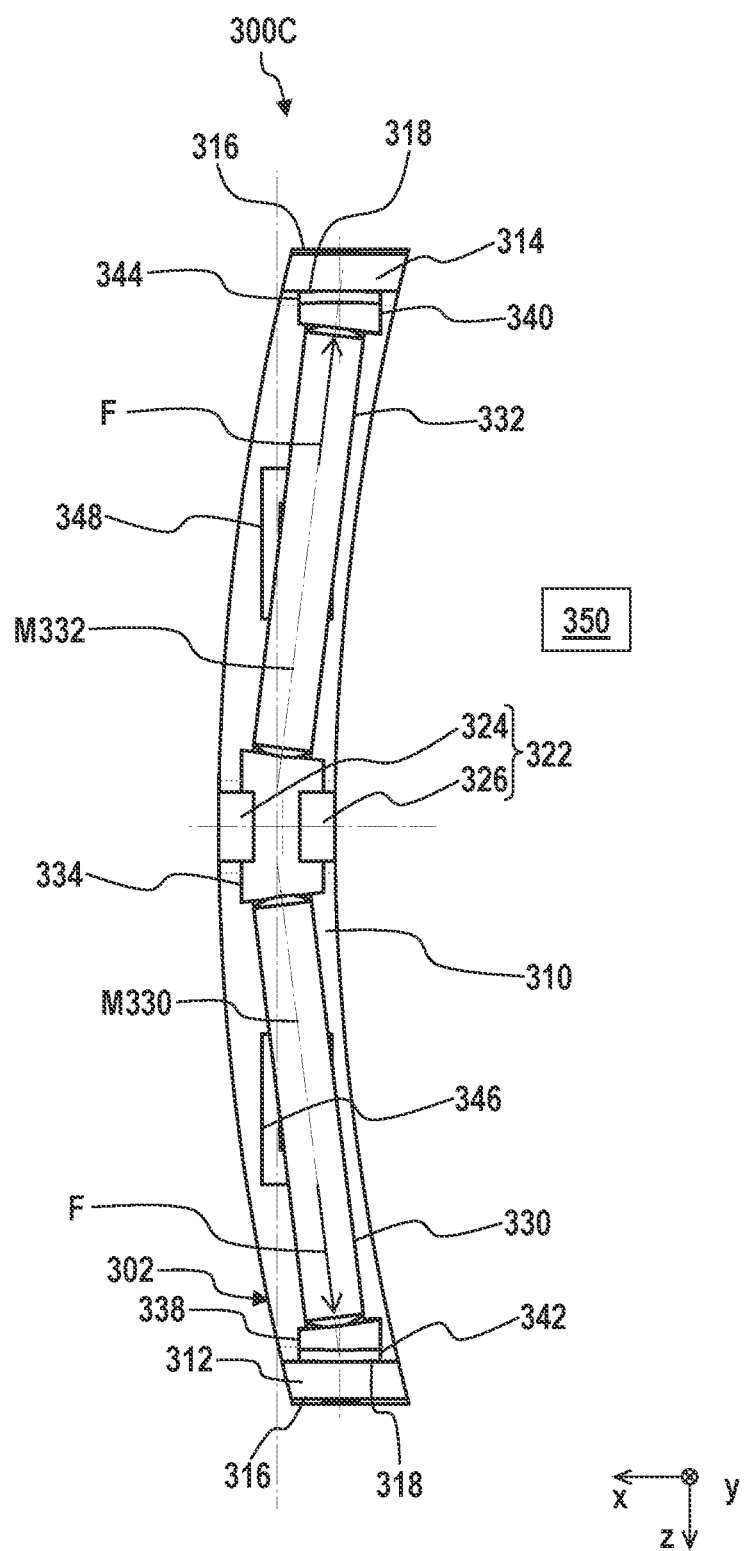
FIG. 24 shows a schematic bottom view of the optical system in accordance with FIG. 20.

FIG. 20 shows a schematic perspective view of a further embodiment of an optical system 300C. FIG. 21 shows a further schematic perspective view of the optical system 300C. FIG. 22 shows a schematic plan view of the optical system 300C. FIG. 23 shows a schematic side view of the optical system 300C. FIG. 24 shows a schematic bottom view of the optical system 300C. FIGS. 20 to 24 are discussed at the same time hereinafter.

The optical system 300C differs from the optical system 300B merely in that the center axes M330, M332 of the actuating elements 330, 332 are not arranged coaxially, but rather in a manner inclined at an angle of inclination β with respect to one another.

Figure 25:
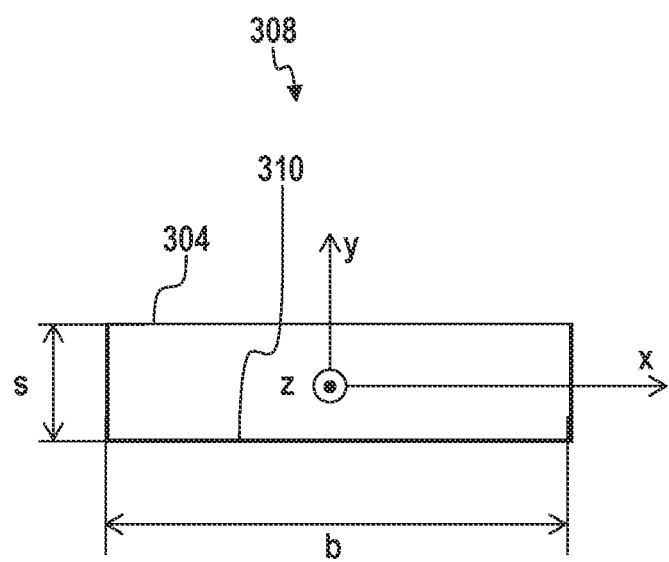
FIG. 25 shows a schematic side view of a base section of an optical element for the optical system in accordance with FIG. 10.

Returning now to FIGS. 10 to 14, an exemplary design calculation for the optical system 300A is given below. In this case, it is assumed that the optically effective surface 304 has a length l of 100 mm and a width b of 10 mm. Furthermore, it is assumed that the base section 308 of the optical element 302 has a thickness s (FIG. 25) of 3 mm as viewed in the y-direction y. The thickness s is oriented along the y-direction y. Therefore, the y-direction y can also be designated as the thickness direction. In a functionally dictated manner, the optical element 302 has a settable concave radius of curvature r of 1400 to 1600 mm.

In order to enable the curvature of the optical element 302 to be restored by internal stress, the optically effective surface 304 has an radius of curvature r of 1600 mm in the undeformed or stress-free state. The deformation of the optical element 302, that is to say the variation of the radius of curvature r from 1400 to 1600 mm, is effected—as mentioned above—with the aid of the actuating elements 330, 332. In this case, it can be desirable for the radius of curvature r not to be altered by a transverse force acting on the base section 308, but rather by bending moments M (FIG. 26) introduced at the ends of the base section. Advantages can include a more compact design, a significantly smaller stroke of the actuating elements 330, 332 may be used and also a smaller deviation of the bending line from the circular shape.

Figure 26:
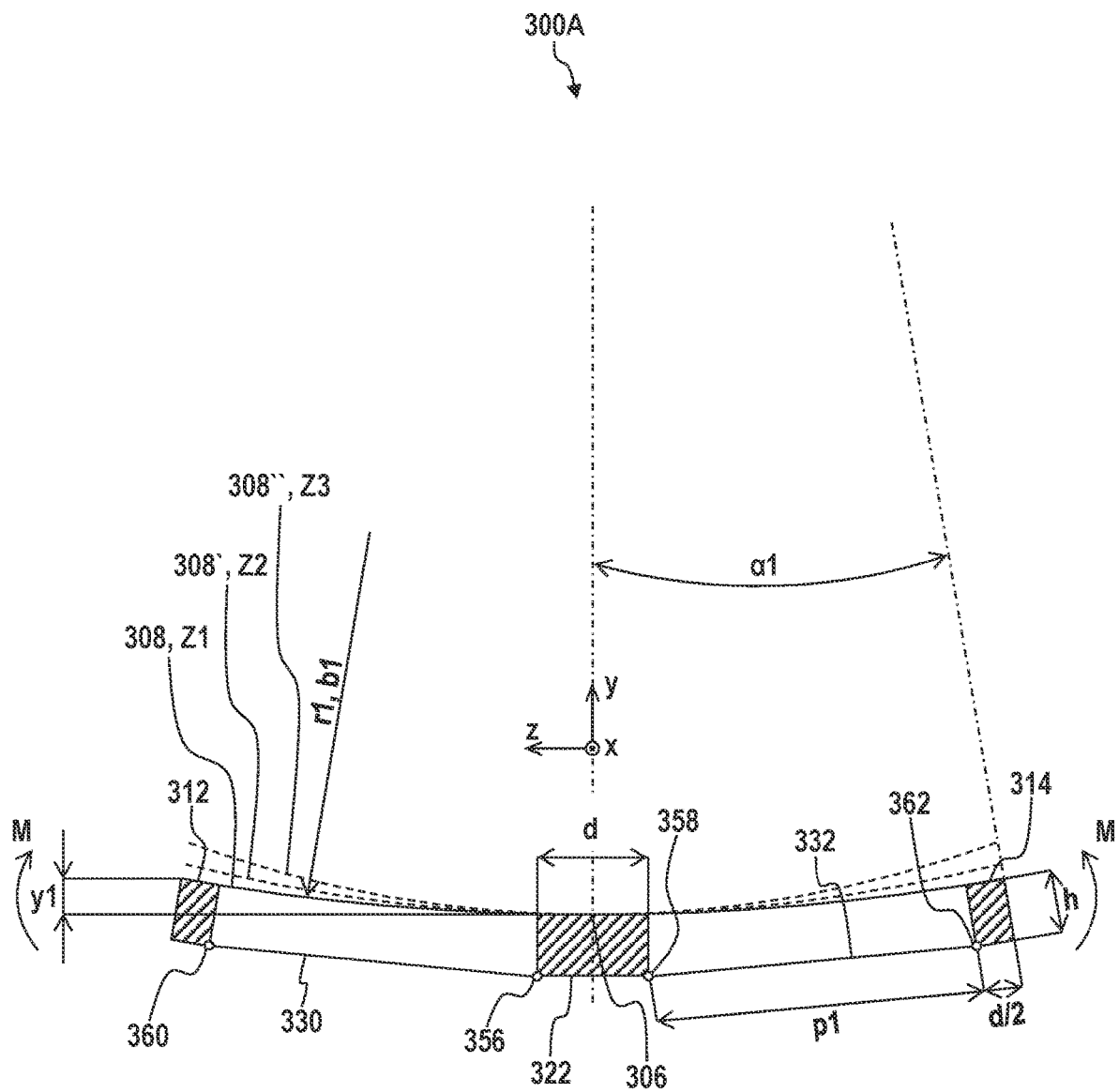
FIG. 26 shows a further schematic view of the optical system in accordance with FIG. 10.

As shown in FIG. 26, frame-fixed coupling points 356, 358 of the two actuating elements 330, 332 bear against the central coupling section 322 or against the bearing element 334, while movable coupling points 360, 362 of the actuating elements 330, 332 act on the lever sections 312, 314 at the outer edge of the base section 308. The actuating force F of the actuating elements 330, 332 and a height h of the lever sections 312, 314 as viewed in the y-direction y yield the value of the bending moment M generated and the resultant deformation of the base section 308 or of the optically effective surface 304. The height h is the length of the used lever or lever arm of the respective lever section 312, 314. A value of 5 mm is assumed for the height h of the lever sections 312, 314. The actuating force F of the actuating elements 330, 332 results from the area moment of inertia of the base section 308, the height h of the lever sections 312, 314, the modulus of elasticity of the material used, for example Invar ALLOY 36, and the desired deformation of the base section 308.

The indices 1, 2 and 3 are used below for the calculation. In this case, as shown in FIG. 26, the index 1 denotes an undeformed or stress-free base section 308 or an undeformed or stress-free optical element 302 having a radius of curvature r1, a length l1 (not shown in FIG. 26), an edge height y1 and an actuating path length p1 of the respective actuating element 330, 332. The undeformed or stress-free optical element 302 or the undeformed or stress-free base section 308 is in a first state Z1. The first state Z1 can also be designated as an undeformed or stress-free state. The curvature of the optical element 302 is illustrated in a greatly exaggerated manner in FIG. 26. The edge height y1 is defined as a distance—measured in the y-direction y—between the vertex 306 and an outermost edge of the base section 308 as viewed in the z-direction z. An angle α1 is defined as an angle between the respective lever section 312, 314 and the y-direction y. An arc length is designated by the reference sign b1.

The index 2 hereinafter denotes a pretensioned optical element 302 or a pretensioned base section 308' having a radius of curvature r2, a length l2, an edge height y2 and an actuating path length p2. The pretensioned optical element 302 or the pretensioned base section 308' is in a second state Z2. The second state Z2 can also be designated as a pretensioned state. In this case, the index 3 denotes a tensioned optical element 302 or a tensioned base section 308" having a radius of curvature r3, a length l3, an edge height y3 and an actuating path length p3. The tensioned optical element 302 or the tensioned base section 308" is in a third state Z3. The third state Z3 can also be designated as a tensioned state.

As mentioned above, the length l1, l2, l3 is in each case 100 mm. The thickness s is 3 mm. The width b is 10 mm. The height h is 5 mm. A distance d between the two coupling points 356, 358 is 10 mm. A respective width of the lever sections 312, 314 is d/2, that is to say 5 mm. The radius r1, r2 and r3 is 1600 mm, 1500 mm and 1400 mm, respectively. The modulus of elasticity of the material Invar ALLOY 36 is $E=1.4*10^5$ N/mm². The 0.2% proof stress of this material is σ02=310 N/mm². It is generally desirable to determine the respective actuating path length p, a difference actuating path length Δp, the magnitude of the bending moment M, the actuating force F and also the stress σ in the base section 308. The following then results for the angle α1:

$$\alpha 1 = \sin\left(\frac{l1}{2*r1}\right) = 0.031255 \text{ rad or}$$

$$\text{where } \alpha 1 * \frac{180°}{\pi} = 1.790785°$$

The following thus results for the arc length b1, b2, b3:
b1=α1*r1=50.008142 mm where it holds true that b2=b1 and b3=b1

It follows from this for the angles α2, α3 and the lengths l2, l3 that:

$$\alpha 2 = \frac{b2}{r2} = 0.033339 \text{ rad or}$$

$$\text{where } \alpha 2 * \frac{180°}{\pi} = 1.910170°$$

$$\alpha 3 = \frac{b3}{r3} = 0.035720 \text{ rad or}$$

$$\text{where } \alpha 3 * \frac{180°}{\pi} = 2.046611°$$

$$l2 = 2*r2*\sin(\alpha 2) = 99.997757 \text{ mm}$$

$$l3 = 2*r3*\sin(\alpha 3) = 99.995016 \text{ mm}$$

The following results for the angles of the non-deformable sections:

$$\alpha 11 = \alpha 1 - \sin\left(\frac{d}{2*r1}\right) = 0.028130 \text{ rad or}$$

$$\text{where } \alpha 11 * \frac{180°}{\pi} = 1.611735°$$

$$\alpha 22 = \alpha 2 - \sin\left(\frac{d}{2*r2}\right) = 0.030005 \text{ rad or}$$

$$\text{where } \alpha 22 * \frac{180°}{\pi} = 1.719184°$$

$$\alpha 33 = \alpha 3 - \sin\left(\frac{d}{2*r3}\right) = 0.032149 \text{ rad or}$$

$$\text{where } \alpha 33 * \frac{180°}{\pi} = 1.841983°$$

The following results for the edge heights y1, y2, y3:

$$y1 = \left(r1 - \frac{d}{2*\sin(\alpha 11)}\right)*(1-\cos(\alpha 11)) = 0.562670 \text{ mm}$$

$$y2 = \left(r2 - \frac{d}{2*\sin(\alpha 22)}\right)*(1-\cos(\alpha 22)) = 0.600174 \text{ mm}$$

$$y3 = \left(r3 - \frac{d}{2*\sin(\alpha 33)}\right)*(1-\cos(\alpha 33)) = 0.643035 \text{ mm}$$

The following results for the actuating path lengths p1, p2, p3 and the difference actuating path length Δp:

$$p1 = 2*\sin\left(\frac{\alpha 1}{2}\right)*(r1+s+h)-d = 40.256137 \text{ mm}$$

$$p2 = 2*\sin\left(\frac{\alpha 2}{2}\right)*(r2+s+h)-d = 40.272523 \text{ mm}$$

$$p3 = 2*\sin\left(\frac{\alpha 3}{2}\right)*(r3+s+h)-d = 40.291229 \text{ mm}$$

$$\Delta p2 = p2 - p1 = 0.016387 \text{ mm}$$

$$\Delta p3 = p3 - p2 = 0.018705 \text{ mm}$$

$$\Delta p = p3 - p1 = 0.035092 \text{ mm}$$

This results in a difference actuating path length Δp of the actuating elements 330, 332 of 35 μm in each case. This value is readily achievable using piezoactuators. The following results for the area moment of inertia of the base section 308:

$$Ix = \frac{b*s^3}{12} = 22.5 \text{ mm}^4$$

Figure 27:
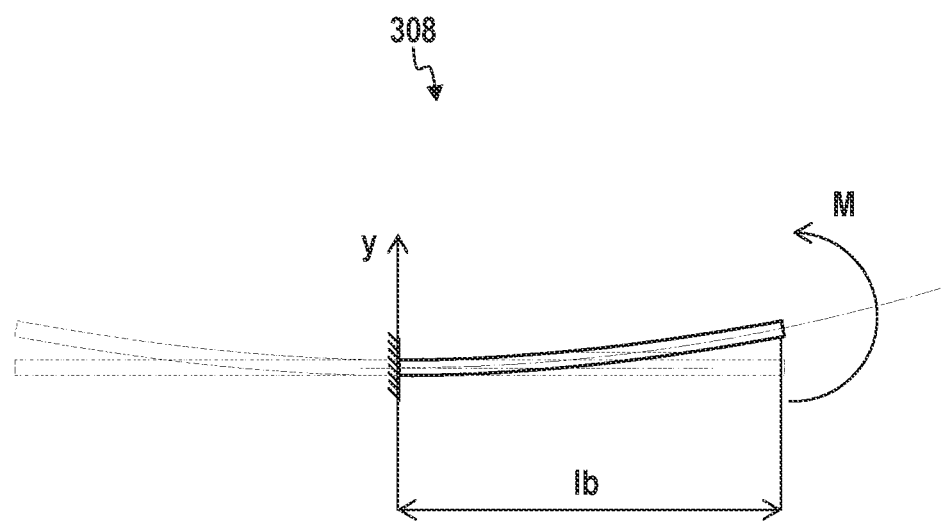
FIG. 27 shows a schematic side view of the base section in accordance with FIG. 25.

FIG. 27 shows the base section 308 as a standard load case of a clamped carrier with a bending moment M acting at the free end and with a free bending length lb. The area moment of inertia Ix, the free bending length lb and the deformation at the free end of the base section 308 determine the required bending moment M. The following deformation results at the free end:

$$\Delta y2 = y2 - y1 = 0.037504 \text{ mm}$$

$$\Delta y3 = y3 - y1 = 0.080365 \text{ mm}$$

The following results for the free bending length lb:

$$lb = \frac{l1}{2} - d = 40 \text{ mm}$$

The resulting bending moment M is then given as:

$$M2 = \frac{2*\Delta y2*E*Ix}{lb^2} = 147.673829 \text{ Nmm}$$

$$M3 = \frac{2*\Delta y3*E*Ix}{lb^2} = 316.437510 \text{ Nmm}$$

This then yields the following for the actuating force F:

$$F2 = \frac{M2}{h} = 29.534766 \text{ N}$$

$$F3 = \frac{M3}{h} = 63.287502 \text{ N}$$

From the bending moment M and the height h of the lever sections 312, 314, the force of the actuators results as approximately 63 N in each case. This value is also achievable using piezoactuators. The following holds true for the resistance moment of the base section 308:

$$Wx = \frac{b*s^2}{6} = 15 \text{ mm}^3$$

In the base section 308 this results in a maximum bending stress of:

$$\sigma b = \frac{M3}{Wx} = 21.095834 \text{ N/mm}^2$$

The bending stress σb resulting from the deformation thus results as approximately 21 N/mm² and is thus far below the 0.2% proof stress of Invar (σ02=310 N/mm²). That is to say that the deformation of the base section 308 lies with high certainty in the purely elastic range. The certainty against plastic deformation is:

$$S = \frac{\sigma 02}{\sigma b} = 14.694844$$

The following maximum tensile stress is induced in the base section 308 by the actuating force F:

$$\sigma z = \frac{F3}{b*s} = 2.109583 \text{ N/mm}^2$$

The tensile stress σz in the base section 308 that is generated by the actuating elements 330, 332 arranged approximately parallel to the base section 308 is thus negligibly low. The actuating force F generates the following strain in the base section 308:

$$\Delta lb = lb * \frac{F3}{E*b*s} = 6.027381 * 10^{-4} \text{ mm}$$

Figure 28:
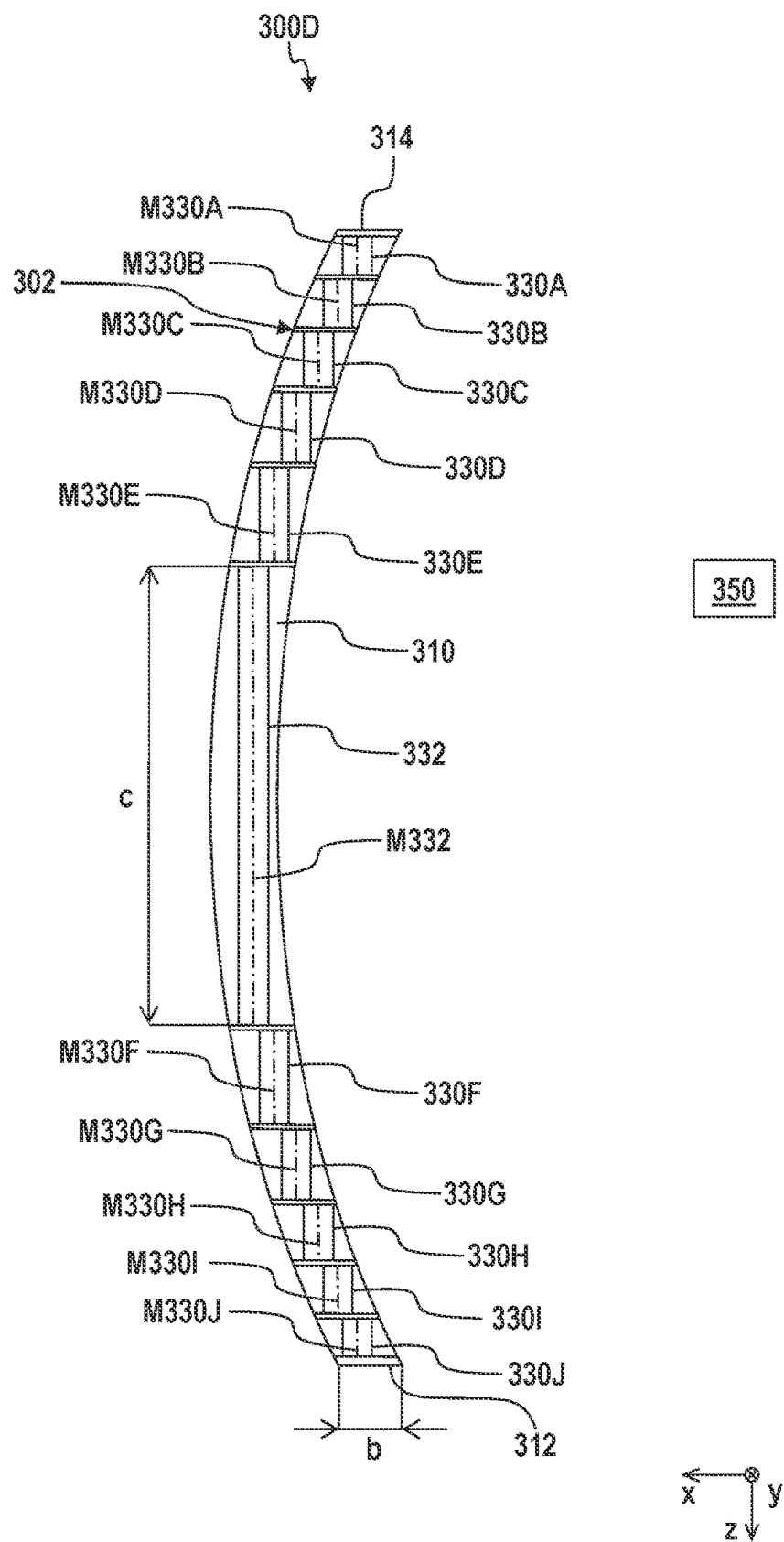
FIG. 28 shows a schematic bottom view of a further embodiment of an optical system for the optical arrangement in accordance with FIG. 2.
Figure 29:
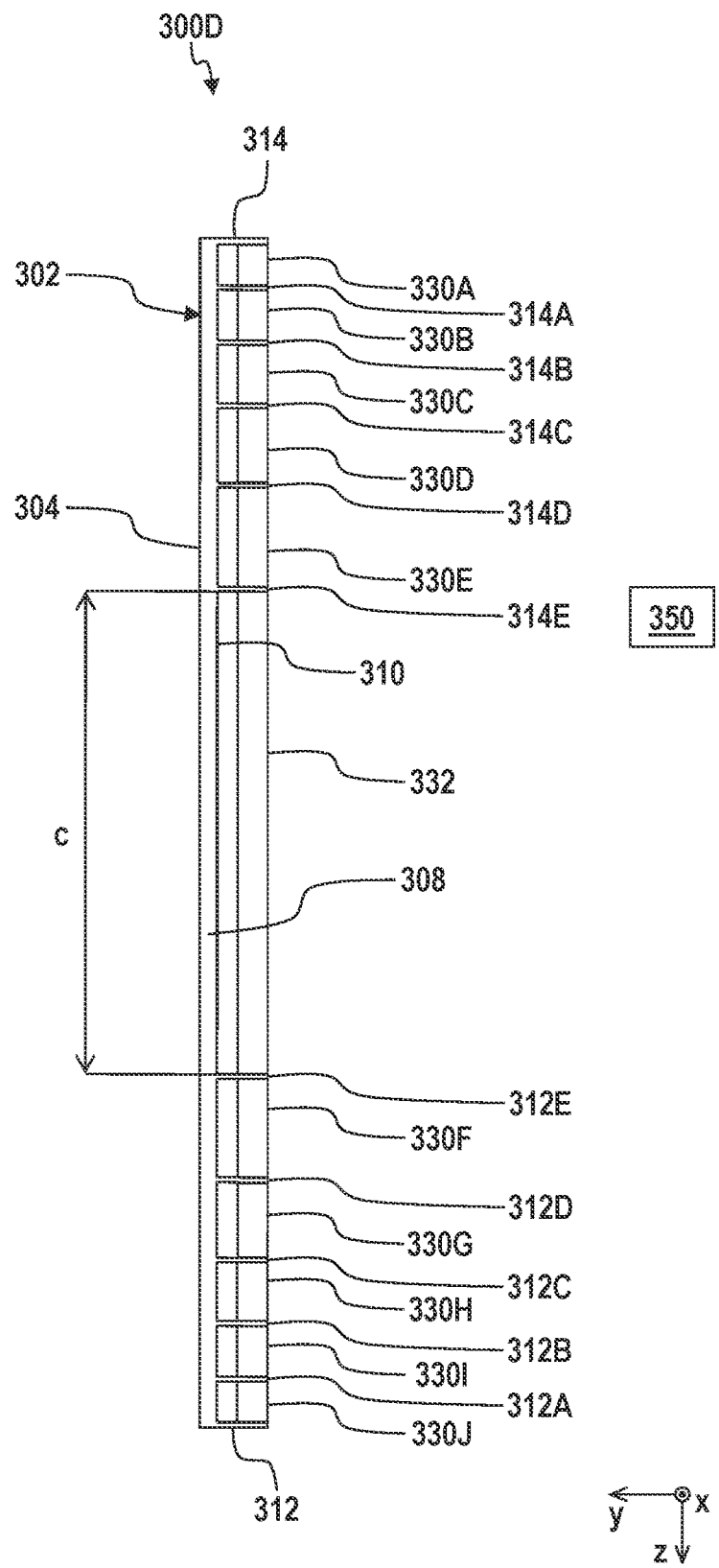
FIG. 29 shows a schematic side view of the optical system in accordance with FIG. 28.

FIG. 28 shows a schematic bottom view of a further embodiment of an optical system 300D. FIG. 29 shows a schematic side view of the optical system 300D. Reference is made below to FIGS. 28 and 29 simultaneously.

The optical system 300D, like the optical system 300B, includes a crescent-shaped optical element 302. A way in which the optical system 300D differs from the optical system 300B is that eleven actuating elements 330A to 330J, 332 rather than two actuating elements 330, 332 are provided. Here in each case two groups of five actuating elements 330A to 330E and 330F to 330J are positioned around a centrally arranged actuating element 332. The number of actuating elements 330A to 300J, 332 is arbitrary. By way of example, three, four, five, six or as many actuating elements 330A to 330J, 332 as desired can be provided. In this case, the actuating elements 330A to 330J, 332 are arranged in such a way that center axes M330A to M330J, M332 of the actuating elements 330A to 330J, 332 are arranged parallel to one another but offset with respect to one another along the x-direction x. In this case, however, center axes M330A, M330J of actuating elements 330A, 330J arranged in pairs on both sides of the central actuating element 332 are positioned coaxially with respect to one another. This also applies to the pairs of actuating elements 330B, 330I, 330C, 330H, 330D, 330G, 330E, 330F that are arranged in pairs on both sides of the central actuating element 332. The fact that the center axes M330A to M330J, M332 are arranged parallel to one another has the technical effect that only the first radius of curvature r is influenced. The second radius of curvature t remains uninfluenced.

As mentioned above, outermost lever sections 312, 314 are provided marginally at the base section 308 of the optical element 302. Further lever sections 312A to 312E and 314A to 314E are provided between the actuating elements 330A to 330J, 332, the actuating elements 330A to 330J, 332 being supported on the lever sections in order to introduce a bending moment M (FIG. 26) into the base section 308. As a result, it is possible to influence the radius of curvature r in small regions of the optically effective surface 304, without deforming the entire optically effective surface 304. On account of this subdivision of the optically effective surface 304 into many small regions, the radius of curvature r is optimally adaptable. In comparison with the optical system 300B, it is possible to obtain a geometry of the optically effective surface 304 that is variable in a targeted manner in small regions.

As viewed along the z-direction z, the lever arms 312, 312A to 312E, 314, 314A to 314E have a small width of 30 to 50% of the width b of the optically effective surface 304. In this case, the width of the lever arms 312, 312A to 312E, 314, 314A to 314E should be understood to mean the geometric extent thereof along the z-direction z. The width b, by contrast, is defined as the geometric extent of the optically effective surface 304 along the x-direction x. The small width of the lever arms 312, 312A to 312E, 314, 314A to 314E improves the optical performance since, with a larger width, the lever arms 312, 312A to 312E, 314, 314A to 314E would function as points of disturbance during the deformation on account of an increased area moment of inertia. As viewed along the z-direction z, the actuating elements 330A to 330J, 332 are arranged one behind another, that is to say in series.

As viewed along the z-direction z, the actuating elements 330A to 330J, 332 each have a width c, wherein the width c is depicted only for the actuating element 332 in FIGS. 28 and 29. Accordingly, the "width" c should be understood to mean the linear extent of the respective actuating element 330A to 330J, 332 along the z-direction z. As shown in FIGS. 28 and 29, the width c of the actuating elements 330A to 330J decreases proceeding from the central actuating element 332 both as viewed along the z-direction z and as viewed counter to the z-direction z. In other words, the central actuating element 332 has the largest width c and the two outermost actuating elements 330A, 330J have the smallest width c. Provision is thus made of a width gradient proceeding from the central actuating element 332 both along the z-direction z and counter to the z-direction z. In the present case, a "width gradient" should be understood to mean that the width c changes, in particular decreases, proceeding from the central actuating element 332 towards the outermost actuating elements 330A, 330J. On account of this width gradient, it is possible to deform the optically effective surface 304 in ever smaller increments proceeding from the centrally arranged actuating element 332 outwards as viewed along the length direction z. This has the technical effect that the optically effective surface 304 can be deformed with greater accuracy at its outermost edge regions as viewed along the length direction z. This improves the optical performance.

Figure 30:
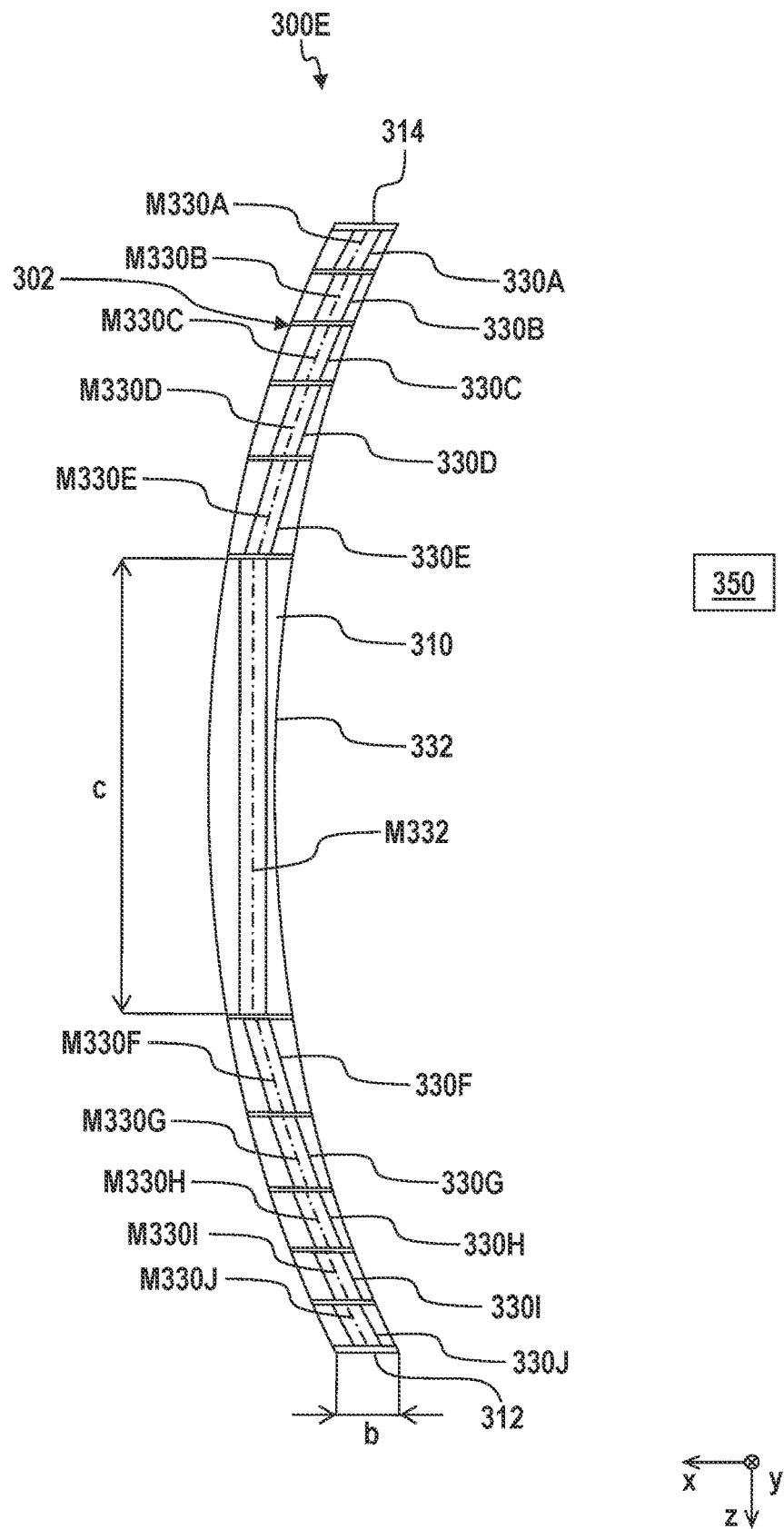
FIG. 30 shows a schematic bottom view of a further embodiment of an optical system for the optical arrangement in accordance with FIG. 2.
Figure 31:
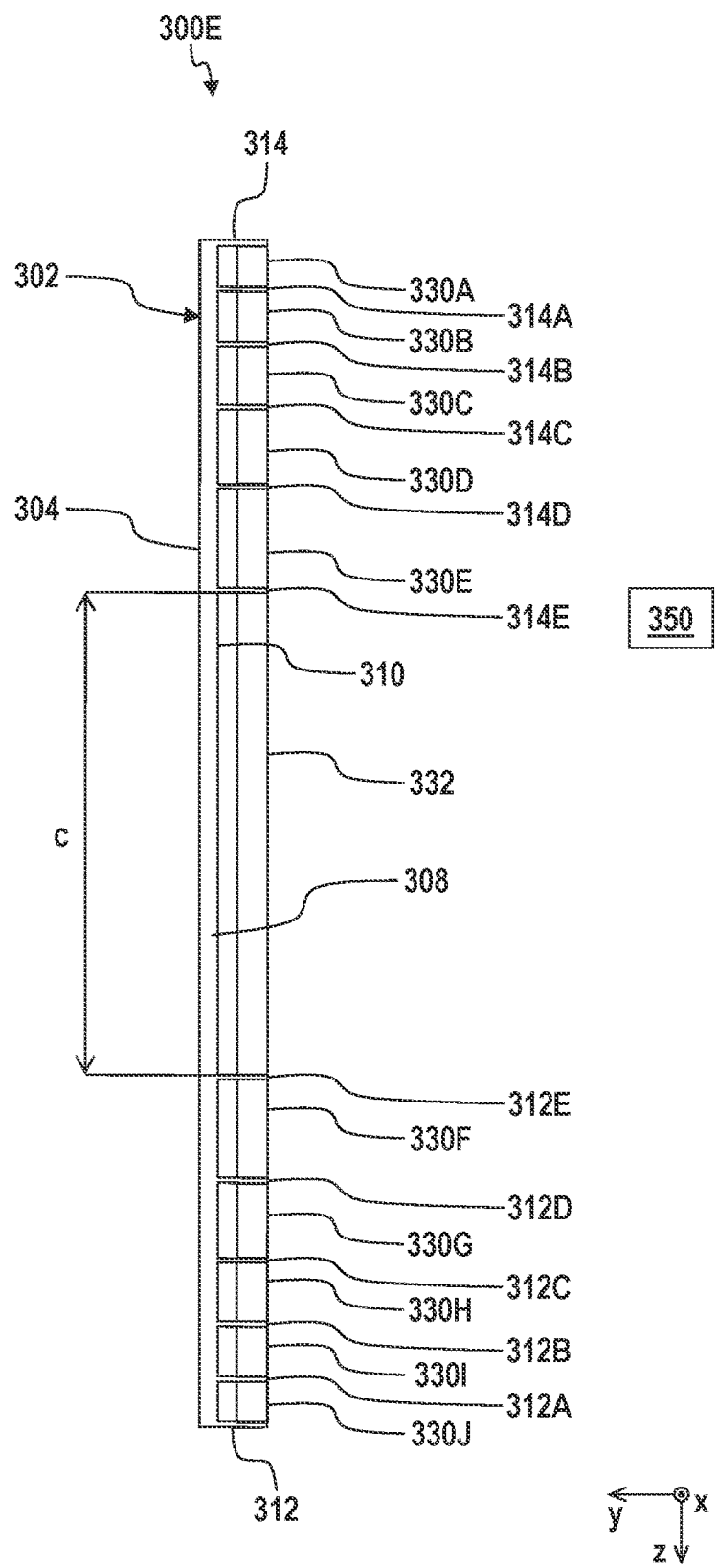
FIG. 31 shows a schematic side view of the optical system in accordance with FIG. 30.

FIG. 30 shows a schematic bottom view of a further embodiment of an optical system 300E. FIG. 31 shows a schematic side view of the optical system 300E. Reference is made below to FIGS. 30 and 31 simultaneously.

The optical system 300E differs from the optical system 300D merely in that the actuating elements 330A to 330J, 332 are arranged in such a way that their center axes M330A to M330J, M332 are not parallel to one another, but rather—as in the case of the optical system 300C—inclined with respect to one another. Otherwise the optical systems 300D, 300E are constructed identically. In particular, the actuating elements 330A to 330J, 332 are positioned tangentially with respect to a curvature of the base section 308. The fact that the center axes M330A to M330J, M332 are arranged obliquely with respect to one another has the technical effect that not only the first radius of curvature r but also the second radius of curvature t is influenced. The deformations of the radius of curvatures r, t are thus superimposed. This can also improve the optical performance.

Although the present disclosure has been described on the basis of illustrative embodiments, it is modifiable in diverse ways.

LIST OF REFERENCE SIGNS

100A EUV lithography apparatus
100B DUV lithography apparatus
102 Beam shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Medium
200 Optical arrangement
202 Mirror
204 Mirror
206 Mirror
208 Mirror
210 Deflection mirror
212 Housing
214 Intermediate focus
216 Beam path
218 Object plane
220 Object field
222 Field facet
222A Field facet
222B Field facet
222C Field facet
222D Field facet
222E Field facet
222F Field facet
224 Main body
226 Optically effective surface
228 Main body
230A Pupil facet
230B Pupil facet
230C Pupil facet
230D Pupil facet
230E Pupil facet
230F Pupil facet
232 Optically effective surface
234A Imaging light beam
234B Imaging light beam
234C Imaging light beam
236 Plasma source
238 Collector
240 Imaging surface
242 Area
300A Optical system/field facet system
300B Optical system/field facet system
300C Optical system/field facet system
300D Optical system/field facet system
300E Optical system/field facet system
302 Optical element
304 Optically effective surface
306 Vertex
308 Base section
308' Base section
308" Base section
310 Rear side
312 Lever section
312A Lever section
312B Lever section
312C Lever section
312D Lever section
312E Lever section
314 Lever section
314A Lever section
314B Lever section
314C Lever section
314D Lever section
314E Lever section
316 Outer surface
318 Inner surface
320 Perforation
322 Coupling section
324 Coupling region
326 Coupling region
328 Perforation
330 Actuating element
330A Actuating element
330B Actuating element
330C Actuating element
330D Actuating element 330E Actuating element
330F Actuating element
330G Actuating element
330H Actuating element
330I Actuating element
330J Actuating element
332 Actuating element
334 Bearing element
336 Bolt
338 Receptacle element
340 Receptacle element
342 Shim
344 Shim
346 Strain detecting element
348 Strain detecting element
350 Control unit
352 Actuating element
354 Plunger
356 Coupling point
358 Coupling point
360 Coupling point
362 Coupling point
a Distance
b Width
b1 Arc length
c Width
d Distance
F Actuating force
h Height
l Length
lb Bending length
M Bending moment
M1 Mirror
M2 Mirror
M3 Mirror
M4 Mirror
M5 Mirror
M6 Mirror
M330 Center axis
M330A Center axis
M330B Center axis
M330C Center axis
M330D Center axis
M330E Center axis
M330F Center axis
M330G Center axis
M330H Center axis
M330I Center axis
M330J Center axis
M332 Center axis
p1 Actuating path length
P1 Tilt position
P2 Tilt position
P3 Tilt position
r Radius of curvature
R330 Direction of effect
R332 Direction of effect
s Thickness
t Radius of curvature
x x-direction
y y-direction
y1 Edge height
z z-direction
Z1 State
Z2 State
Z3 State
α1 Angle
β Angle of inclination

What is claimed is:

1. A field facet system, comprising:
an optical element, comprising:
a base section comprising an optically effective surface; and
a plurality of lever sections at a rear side of the base section, the lever sections extending away from the optically effective surface along a first direction; and
two or more piezoactuators, each of the two or more piezoactuators having a longitudinal direction which is perpendicular to the first direction, each of the two or more piezoactuators configured to extend along its longitudinal direction to apply an actuating force to at least one of the lever sections so that the lever sections apply a bending moment to the base section to elastically deform the base section to alter a radius of curvature of the optically effective surface,
wherein the piezoactuators are arranged in series along a length direction which is perpendicular to the first direction.

2. The field facet system of claim 1, wherein the two or more piezoactuators and the plurality of lever sections are configured to bring the base section from an un-deformed state to a deformed state, and the radius of curvature decreases upon the base section being brought from the undeformed state to the deformed state.

3. The field facet system of claim 2, wherein the base section is spring-pretensioned along the longitudinal direction of the piezoactuators so that the base section is configured to automatically bring itself from the deformed state to the undeformed state.

4. The field facet system of claim 1, wherein a direction of effect of the actuating force is parallel to the rear side or oblique to the rear side.

5. The field facet system of claim 1, wherein the first direction is perpendicular to the rear side.

6. The field facet system of claim 1, wherein the two or more piezoactuators comprise a first group of piezoactuators, a second group of piezoactuators, and a central piezoactuator arranged between the first and second groups of piezoactuators.

7. The field facet system of claim 6, wherein in a direction perpendicular to the longitudinal direction of the central piezoactuator:
a width of the central piezoactuator is greater than a width of individual piezoactuators of the first group of piezoactuators; and
the width of the central piezoactuator is greater than a width of individual piezoactuators of the second group of piezoactuators.

8. The field facet system of claim 7, wherein, proceeding from the central piezoactuator towards a respective outermost actuating element, the width of the piezoactuators decreases continuously along the length direction.

9. The field facet system of claim 1, wherein:
the rear side of the optical element comprises a coupling section;
a first piezoactuator of the two or more piezoactuators is between the coupling section and a first lever section of the plurality of lever sections; and
a second piezoactuator of the two or more piezoactuators is between coupling section and a second lever section of the plurality of sections.

10. The field facet system of claim 9, wherein:
the coupling section is at a center of the base section;
the first lever section is at a first end side at the base section; and
the second lever section is at a second end side of the base section.

11. The field facet system of claim 1, wherein:
the two or more piezoactuators comprise first and second piezoactuators;
the first and second actuating elements piezoactuators are supported on one another;
the plurality of lever sections comprise first and second lever sections;
when the first piezoactuator extends along its longitudinal direction, the first actuating element applies its piezoactuator to the first lever section; and
when the second piezoactuator extends along its longitudinal direction, the second piezoactuator applies its actuation force to the second lever section.

12. The field facet system of claim 1, wherein center axes of the two or more piezoactuators are parallel to one another, or the center axes of the two or more piezoactuators are at an oblique angle of inclination with respect to one another.

13. The field facet system of claim 1, wherein the lever sections and the two or more piezoactuators alternate along the length direction.

14. The field facet system of claim 1, wherein, in plan view, the optically effective surface is rectangular, arcuately curved, or crescent-shaped.

15. The field facet system of claim 1, further comprising a strain detecting element configured to detect an elastic deformation of the base section.

16. An optical arrangement, comprising:
a field facet mirror comprising a plurality of field facet systems, each field facet system comprising a field facet system according to claim 1; and
a pupil facet mirror comprising a plurality of pupil facets.

17. The optical arrangement of claim 16, wherein:
along a beam path of the optical arrangement, the field facet mirror is upstream of the pupil facet mirror;
a subgroup of the plurality of pupil facets are assigned to at least one of the field facet systems;
the at least one field facet system is tiltable between a plurality of tilt positions so that the at least one field facet system in a respective tilt position is configured to image an intermediate focus of an EUV source onto a pupil facet assigned to the respective tilt position; and
the radius of curvature of the optically effective surface of the at least one field facet system is variable so that the intermediate focus in each of the tilt positions is focused onto the pupil facet assigned to the respective tilt position.

18. An apparatus, comprising:
a field facet system according to claim 1,
wherein the apparatus is a lithography apparatus.

19. The apparatus of claim 18, wherein the apparatus comprises an illumination system, and the illumination system comprises the field facet system.

20. The field facet system of claim 1, wherein a direction of effect of the actuating force is parallel to the rear side or oblique to the rear side, and the first direction is perpendicular to the rear side.

21. The field facet system of claim 1, wherein the lever sections directly contact the base section.

22. The field facet system of claim 21, wherein each piezoactuator directly contacts two different lever sections.

23. The field facet system of claim 1, wherein each piezoactuator directly contacts two different lever sections.

24. A field facet system, comprising:
an optical element, comprising:
a base section comprising an optically effective surface; and
a plurality of lever sections at a rear side of the base section, the lever sections extending away from the optically effective surface along a first direction; and
two or more actuating elements, each of the two or more actuating elements having a longitudinal direction which is perpendicular to the first direction, each of the two or more actuating elements configured to extend along its longitudinal direction to apply an actuating force to at least one of the lever sections so that the lever sections apply a bending moment to the base section to elastically deform the base section to alter a radius of curvature of the optically effective surface,
wherein the actuating elements are arranged in series along a length direction which is perpendicular to the first direction, and each actuating element directly contacts two different lever sections.

25. The field facet system of claim 24, wherein the lever sections directly contact the base section.

* * * * *

UNITED STATES PATENT AND TRADEMARK OFFICE
CERTIFICATE OF CORRECTION

| | | |
|---|---|---|
| PATENT NO. | : 11,815,817 B2 | Page 1 of 1 |
| APPLICATION NO. | : 17/553040 | |
| DATED | : November 14, 2023 | |
| INVENTOR(S) | : Guenter Rudolph and Joram Rosseels | |

It is certified that error appears in the above-identified patent and that said Letters Patent is hereby corrected as shown below:

In the Specification

Column 7, Line 4, delete "section" insert -- section. --.

In the Claims

Column 28, Line 27, Claim 2, delete "un-deformed" insert -- undeformed --.

Column 29, Line 10, Claim 11, after "second" delete "actuating elements".

Signed and Sealed this
Thirteenth Day of February, 2024

*Katherine Kelly Vidal*

Katherine Kelly Vidal
*Director of the United States Patent and Trademark Office*